United States Patent
Park et al.

(10) Patent No.: US 11,074,835 B2
(45) Date of Patent: Jul. 27, 2021

(54) FLEXIBLE DISPLAY DEVICE

(71) Applicant: SAMSUNG DISPLAY CO., LTD., Yongin-si (KR)

(72) Inventors: Dong Jin Park, Seongnam-si (KR); Dong Cheol Kim, Suwon-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 245 days.

(21) Appl. No.: 16/270,737

(22) Filed: Feb. 8, 2019

(65) Prior Publication Data

US 2019/0251875 A1    Aug. 15, 2019

(30) Foreign Application Priority Data

Feb. 9, 2018    (KR) .......................... 10-2018-0016462

(51) Int. Cl.
| | | |
|---|---|---|
| *G09F 9/30* | (2006.01) | |
| *H01L 51/00* | (2006.01) | |
| *G06F 3/041* | (2006.01) | |
| *G06F 1/16* | (2006.01) | |
| *H01L 27/32* | (2006.01) | |

(52) U.S. Cl.
CPC ............ *G09F 9/301* (2013.01); *G06F 1/1652* (2013.01); *G06F 3/0412* (2013.01); *H01L 27/323* (2013.01); *H01L 27/3225* (2013.01); *H01L 51/0097* (2013.01); *G06F 2203/04102* (2013.01); *H01L 2251/5338* (2013.01)

(58) Field of Classification Search
CPC . G09F 9/301; H01L 27/3225; H01L 51/0097; H01L 27/323; H01L 2251/5338; G06F 3/0412; G06F 1/1652; G06F 2203/04102; Y02E 10/549
See application file for complete search history.

(56) References Cited

U.S. PATENT DOCUMENTS 6,453,100 B1 *  9/2002  Takeuchi ............. G02B 26/004
                                                    345/85
7,675,593 B2    3/2010  Kim et al.
(Continued)

FOREIGN PATENT DOCUMENTS

| KR | 10-2014-0036617 | 3/2014 |
|----|-----------------|--------|
| KR | 10-2016-0078314 | 7/2016 |

(Continued)

OTHER PUBLICATIONS

Travis Deyle, "Electroactive Polymers (EAP) as Artificial Muscles (EDAM) for Robot Applications", http://www.hizook.com/blog/2009/12/28/electroactive-polymers-eap-artificial-muscles-epam-robot-applications—URL—PDF1 (last visited on Feb. 7, 2019).

(Continued)

*Primary Examiner* — Abhishek Sarma
(74) *Attorney, Agent, or Firm* — F. Chau & Associates, LLC

(57) ABSTRACT

A flexible display device includes a display panel configured to display an image, and a first electrical actuation part disposed at a first side of the display panel. The first electrical actuation part includes a first electro-active polymer and a first pair of electrodes. A first unit structure including the first electro-active polymer and the first pair of electrodes is repeatedly formed in the first electrical actuation part.

19 Claims, 20 Drawing Sheets

(56) References Cited

U.S. PATENT DOCUMENTS

| | | | |
|---|---|---|---|
| 2008/0303782 A1* | 12/2008 | Grant | G06F 1/1652 345/156 |
| 2010/0295812 A1* | 11/2010 | Burns | G06F 3/045 345/174 |
| 2011/0241998 A1 | 10/2011 | McKinney et al. | |
| 2012/0256720 A1* | 10/2012 | Byun | H01C 10/10 338/2 |
| 2013/0286462 A1* | 10/2013 | Yeo | H01L 27/3244 359/291 |
| 2014/0015402 A1 | 1/2014 | Ahn et al. | |
| 2014/0176826 A1* | 6/2014 | Kim | G06F 3/0446 349/12 |
| 2015/0192481 A1* | 7/2015 | Nguyen | G09G 3/20 345/206 |
| 2015/0382446 A1* | 12/2015 | Kwon | H01L 27/3276 174/251 |
| 2016/0179253 A1* | 6/2016 | Franklin | G06F 1/1677 345/174 |
| 2017/0219444 A1 | 8/2017 | Kim et al. | |

FOREIGN PATENT DOCUMENTS

| | | |
|---|---|---|
| KR | 10-2016-0089164 | 7/2016 |
| WO | 2016-208857 | 12/2016 |

OTHER PUBLICATIONS

"Electroactive polymer enables more compact lab-on-a-chip", http://archive.eetasiacom/www.eetasia.com/ART_8800687426_499495_NT_99bc1289.HTM—URL—PDF2 (last visited on Feb. 7, 2019).

European Search Report dated Jun. 25, 2019 in corresponding European Patent Application No. 19156204.0.

* cited by examiner

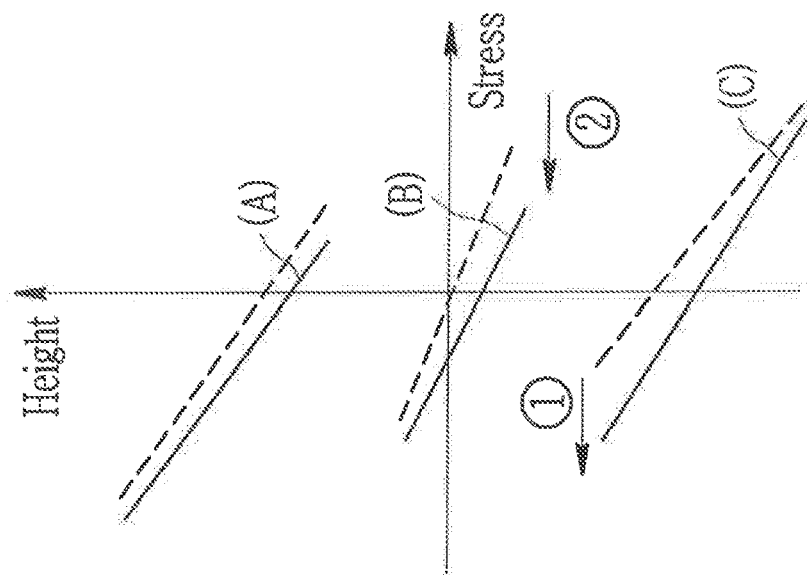
FIG. 4
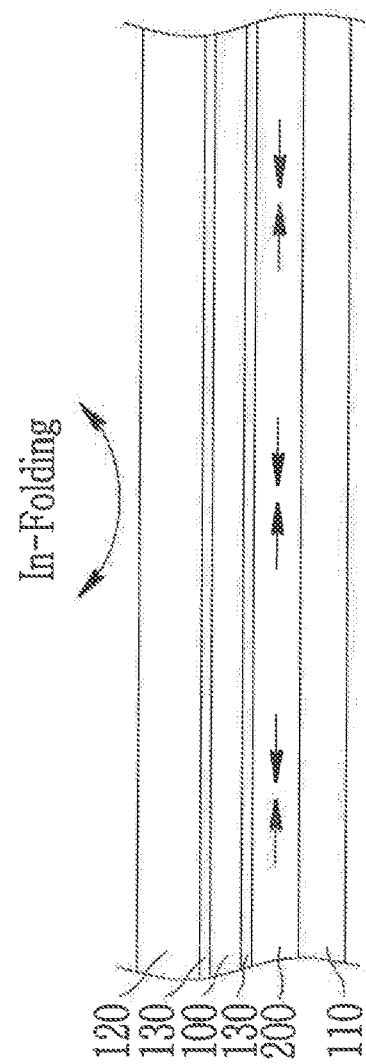

FIG. 17
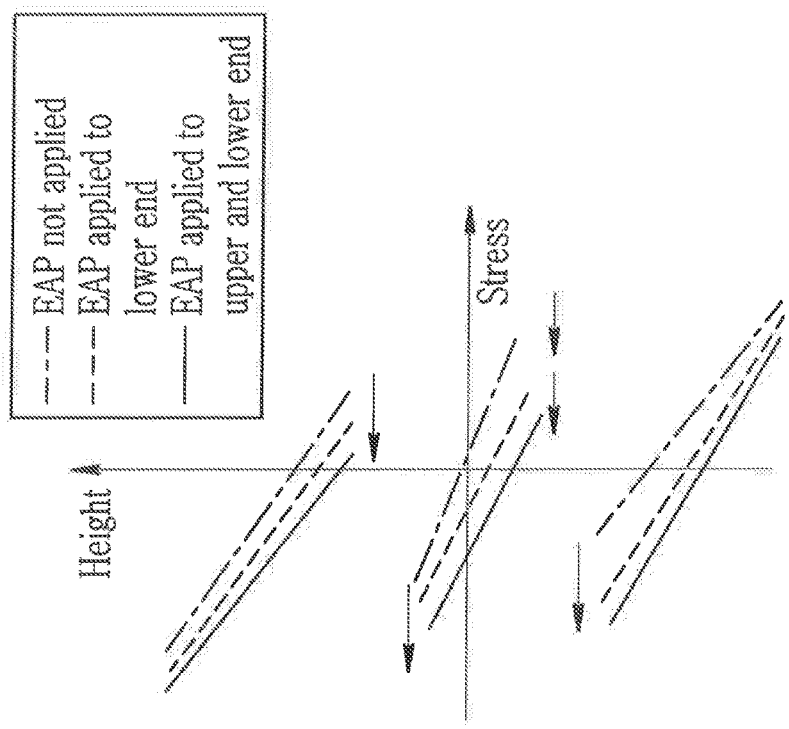
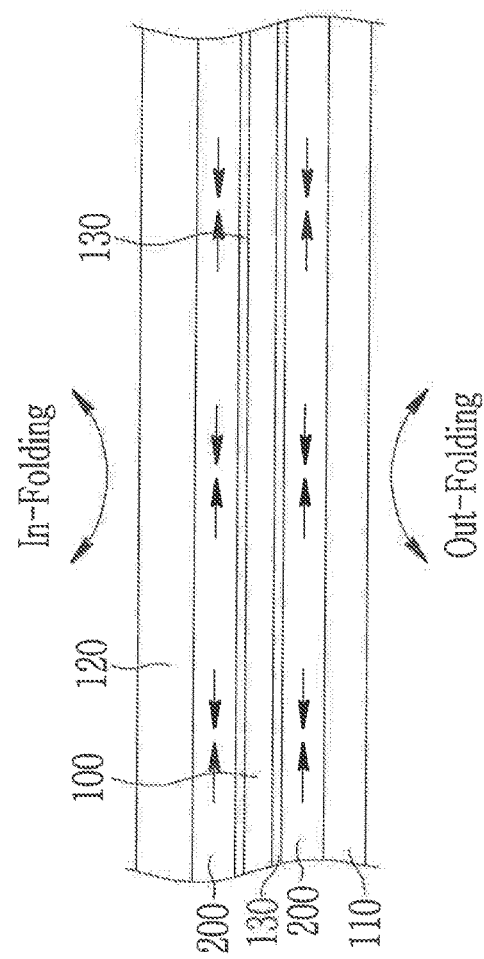

FLEXIBLE DISPLAY DEVICE

CROSS-REFERENCE TO RELATED APPLICATIONS

This application claims priority under 35 U.S.C. § 119 to Korean Patent Application No. 10-2018-0016462 filed on Feb. 9, 2018, the disclosure of which is incorporated by reference herein in its entirety.

TECHNICAL FIELD

The present disclosure relates to a display device, and more particularly, to a flexible display device.

DISCUSSION OF THE RELATED ART

A display device such as an organic light emitting diode (OLED) display device includes a display panel, which includes a plurality of layers and elements disposed on a substrate. Conventionally, glass is used as a substrate of a display panel. However, the glass substrate is too rigid to bend. Recently, flexible display devices that use a flexible substrate such as a plastic, which is light and bendable, have been developed.

A flexible display device may be classified as a bendable display device, a foldable display device, or a rollable display device depending on its use or form. When a plurality of layers included in such a flexible display device are folded several times, buckling, in which a portion thereof is lifted, or interlayer separation, may occur. In addition, when the display device is folded, a layer positioned at an inner side thereof may be subjected to a slip phenomenon in which an end thereof slips, thereby causing the layer on the end side to be separated therefrom. As a result, the reliability of the flexible display device may be deteriorated.

SUMMARY

Exemplary embodiments of the present invention improve reliability of a flexible display device by preventing a slip phenomenon, buckling in which a portion is lifted, or interlayer separation in the flexible display device.

According to an exemplary embodiment of the present invention, a flexible display device includes a display panel configured to display an image, and a first electrical actuation part disposed at a first side of the display panel. The first electrical actuation part includes a first electro-active polymer and a first pair of electrodes. A first unit structure including the first electro-active polymer and the first pair of electrodes is repeatedly formed in the first electrical actuation part.

In an exemplary embodiment, the first unit structure further includes a seal member that divides the repeatedly formed first unit structures, and the first pair of electrodes includes an upper electrode disposed above the seal member and a lower electrode disposed below the seal member.

In an exemplary embodiment, the seal member partitions the first electro-active polymer. The seal member includes a columnar portion that supports the upper electrode and the lower electrode, and a plurality of horizontal portions that respectively extend from the columnar portion along a surface of the lower electrode and along a surface of the upper electrode.

In an exemplary embodiment, an end of the horizontal portions does not contact the columnar portion of an adjacent first unit structure, and an opening is disposed at the end of the horizontal portions.

In an exemplary embodiment, a first horizontal portion extending along the surface of the lower electrode and a second horizontal portion extending along the surface of the upper electrode extend away from the columnar portion in different directions. The first horizontal portion and the second horizontal portion belong to the plurality of horizontal portions.

In an exemplary embodiment, the first electrical actuation part includes a first zone, a second zone, and a third zone. The first to third zones include first unit structures having different widths. A width of the first unit structure of the first zone is larger than a width of the first unit structure of the second zone, and the width of the first unit structure of the second zone is larger than a width of the first unit structure of the third zone.

In an exemplary embodiment, the third zone is disposed near a center of the display panel, the second zone is disposed outside the third zone, and the first zone is disposed outside the second zone.

In an exemplary embodiment, the first zone is disposed at one side of the display panel, and the second zone is disposed at a second side of the display panel that opposes the first side.

In an exemplary embodiment, the repeatedly formed first unit structures have a same width.

In an exemplary embodiment, the flexible display device further includes a second electrical actuation part disposed at a second side of the display panel. The second electrical actuation part includes a second electro-active polymer and a second pair of electrodes. A second unit structure including the second electro-active polymer and the second pair of electrodes is repeatedly formed in the second electrical actuation part.

In an exemplary embodiment, the repeatedly formed first unit structures and the repeatedly formed second unit structures have a same width, and the repeatedly formed first unit structures are arranged in a same pattern as the repeatedly formed second unit structures.

In an exemplary embodiment, the first pair of electrodes includes a plurality of upper electrodes and one lower electrode, the lower electrode has one plate-like structure, and the upper electrodes are insulated from one another.

In an exemplary embodiment, each of the upper electrodes includes a vertical portion and a plurality of horizontal portions extended from the vertical portion.

In an exemplary embodiment, the flexible display device further includes a first strain gauge layer disposed at a surface of the first side of the display panel. The first strain gauge layer senses a first stress applied to the surface of the first side of the display panel.

In an exemplary embodiment, the first strain gauge layer is disposed between the first electrical actuation part and the display panel, the flexible display device further includes a second strain gauge layer disposed at a surface of a second side of the display panel, and the second strain gauge layer senses a second stress applied to the surface of the second side of the display panel.

In an exemplary embodiment, the flexible display device further includes a processor configured to control the first electrical actuation part to have a compressive force by receiving stress information sensed by the first strain gauge layer and applying a voltage to the first pair of electrodes of the first electrical actuation part.

In an exemplary embodiment, the flexible display device further includes a flexible circuit board electrically connected to the first strain gauge layer and the first electrical actuation part, and a non-flexible circuit board electrically connected to the flexible circuit board. The processor is disposed in the flexible circuit board or the non-flexible circuit board.

In an exemplary embodiment, the first electro-active polymer includes at least one of an electrical electro-active polymer material or an ionic electro-active polymer material.

In an exemplary embodiment, the flexible display device further includes a window disposed on a front surface of the display panel, a base film disposed on a rear surface of the display panel, a first adhesive layer that includes a pressure sensitive adhesive, and a second adhesive layer that includes the pressure sensitive adhesive. The window and the display panel are adhered to each other by the first adhesive layer, the display panel and the first electrical actuation part are adhered to each other by the second adhesive layer, and the base film is disposed outside the first electrical actuation part.

According to an exemplary embodiment of the present invention, the display panel is capable of touch sensing.

According to an exemplary embodiment of the present invention, a flexible display device includes a display panel configured to display an image, and an electrical actuation part disposed at a side of the display panel. The electrical actuation part includes an upper electrode, a lower electrode, and an electro-active polymer disposed between the upper electrode and the lower electrode. An electric field is generated by the upper electrode and the lower electrode in response to a voltage being applied to the upper electrode and the lower electrode, the electric field is applied to the electro-active polymer, and the electro-active polymer generates a compressive force in response to the electric field being applied to the electro-active polymer.

BRIEF DESCRIPTION OF THE DRAWINGS

The above and other features of the present invention will become more apparent by describing in detail exemplary embodiments thereof with reference to the accompanying drawings, in which:

FIG. 4 illustrates an actuation characteristic of the display device according to the exemplary embodiment of FIG. 1 and a stress applied to the display device.

FIG. 17 illustrates an actuation characteristic of the display device according to the exemplary embodiment of FIG. 16 and a stress applied to the display device.

DETAILED DESCRIPTION OF THE EXEMPLARY EMBODIMENTS

Figure 1:
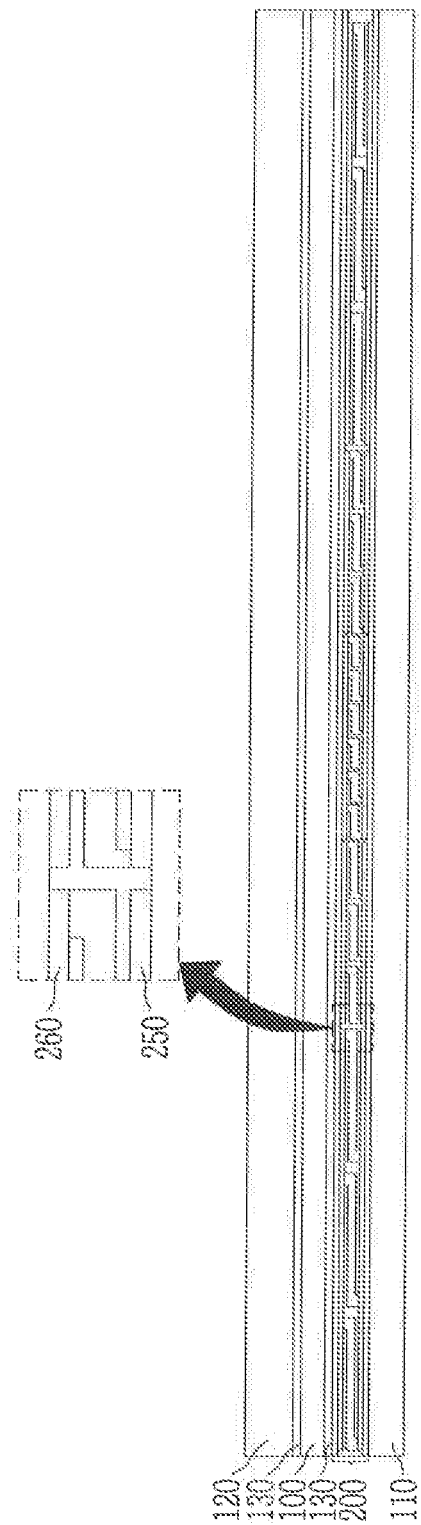
FIG. 1 is a cross-sectional view illustrating a display device according to an exemplary embodiment of the present invention.

Exemplary embodiments of the present invention will be described more fully hereinafter with reference to the accompanying drawings. Like reference numerals may refer to like elements throughout the accompanying drawings.

It will be understood that when an element such as a layer, film, region, or substrate is referred to as being "on" another element, it can be directly on the other element or intervening elements may also be present. In contrast, when an element is referred to as being "directly on" another element, there are no intervening elements present. Further, the word "on" or "above" means positioned on or below the object portion, and does not necessarily mean positioned on the upper side of the object portion based on a gravitational direction.

Spatially relative terms, such as "beneath", "below", "lower", "under", "above", "upper", etc., may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below.

It will be understood that the terms "first," "second," "third," etc. are used herein to distinguish one element from another, and the elements are not limited by these terms. Thus, a "first" element in an exemplary embodiment may be described as a "second" element in another exemplary embodiment.

Hereinafter, a display device according to an exemplary embodiment of the present invention will be described with reference to FIG. 1.

FIG. 1 is a cross-sectional view illustrating a display device according to an exemplary embodiment of the present invention.

Referring to FIG. 1, in an exemplary embodiment, the display device includes a display panel 100, a window 120, a base film 110, and an electrical actuation part 200, as well as adhesive layers 130 respectively positioned at opposite sides of the display panel 100.

The display panel 100 is capable of displaying images even when it is bent or folded. Such a panel includes, for example, an organic light emitting diode display panel. An organic light emitting diode display panel is a display panel that emits light by allowing a current to flow to an organic light emitting element, and a displayed luminance is not changed even when the display panel is bent or folded. Thus, an organic light emitting diode display panel is suitable for use in a flexible display device. The display panel 100 may include a touch sensor that detects touch, thus providing the display panel 100 with touch sensing functionality. Although the exemplary embodiment described herein includes a touch sensing function, exemplary embodiments of the present invention are not limited thereto. For example, a display panel according to exemplary embodiments of the present invention may not include a touch sensing function.

The window 120 is positioned on a front surface of the display panel 100. The window 120 serves to protect the front surface of the display panel 100 from the outside, and is made of, for example, plastic. By providing a constant thickness, the front surface of the display panel 100 may be protected from a force or an impact, as well as from scratches caused by sharp objects.

The display device may further include the base film 110. The base film 110 protects a rear surface thereof. The base film 110 serves to protect the display panel 100 from an impact from the rear surface. In addition, when the display device is used as a part of any electronic device (e.g., a mobile phone), the base film 110 also serves to prevent damage due to collision with components of the electronic device.

The adhesive layer 130 is positioned at the opposite side of the display panel 100. The adhesive layer 130 serves to allow the display panel 100 and other layers to adhere to each other. Various adhesives may be used as the adhesive layer 130. A pressure sensitive adhesive (PSA) may be used to relieve the display panel 100, the window 120, and the base film 110 when they are subjected to different stresses due to bending of the flexible display device. The PSA includes a flexible material.

When the display panel 100 and other layers are bent, one side of the display panel 100 is subjected to a tensile stress. In this case, when the tensile stress is not relieved and becomes larger than a certain level, problems such as thin film separation and buckling may occur.

In an exemplary embodiment, the electrical actuation part 200 is included in the display panel. The electrical actuation part 200 may prevent or reduce the occurrence of the problems described above. The electrical actuation part 200 is attached to a rear surface of the display panel 100 by the lower adhesive layer 130, and is positioned inside the base film 110.

According to an exemplary embodiment, the base film 110 and the electrical actuation part 200 may be attached by using an adhesive layer such as a PSA.

Figure 2:
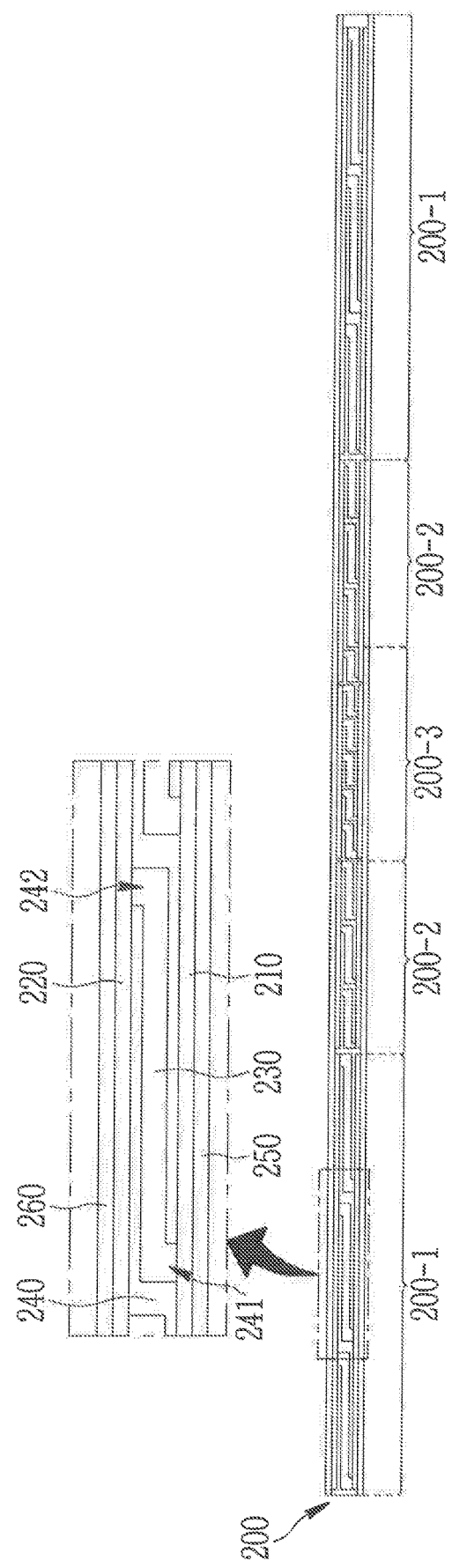
FIG. 2 is an enlarged cross-sectional view illustrating an electrical actuation part according to an exemplary embodiment of the present invention.

A structure of the electrical actuation part 200 is according to an exemplary embodiment of the present invention is illustrated in FIG. 2.

FIG. 2 is an enlarged cross-sectional view illustrating an electrical actuation part according to an exemplary embodiment of the present invention (e.g., according to the exemplary embodiment of FIG. 1).

Referring to FIG. 2, in an exemplary embodiment, the electrical actuation part 200 is divided into three zones 200-1, 200-2, and 200-3. The zones 200-1, 200-2, and 200-3 have a structure in which one unit structure having a same structure is repeatedly formed. In addition, a difference between the three zones 200-1, 200-2, and 200-3 is a size of the unit structure. Otherwise, no structural difference exists.

In FIG. 2, the unit structure positioned in the first zone 200-1 is enlarged and illustrated.

One unit structure includes two electrodes 210 and 220 that are vertically positioned, and an electro-active polymer (EAP) 230 positioned therebetween. The electrode 210 may be referred to herein as a lower electrode, and the electrode 220 may be referred to herein as an upper electrode. A characteristic of the electro-active polymer 230 is changed by an electric field generated by the lower electrode 210 and the upper electrode 220. In an exemplary embodiment, a compressive force is increased in a left-right direction. As a result, the electrical actuation part 200 directly reduces a tensile stress of the left-right direction generated by bending an adjacent layer (e.g., the display panel 100 or the base film 110 in FIG. 1). In addition, in a first layer (e.g., the window 120 in FIG. 1) separated from the electrical actuation part 200, a tensile stress of a second layer (e.g., the display panel 100) positioned therebetween is reduced, and a tensile stress of the first layer (e.g., the window 120) is also reduced.

In an exemplary embodiment, the electrical actuation part 200 further includes a seal member 240. The seal member 240 may be used to divide unit structures. The seal member 240 may be formed of a nonconductive insulating material such as, for example, Si, $SiO_x$, $SiN_x$, etc.

The seal member 240 partitions the electro-active polymer 230. For this purpose, the seal member 240 includes a columnar portion and horizontal portions extended from the columnar portion along surfaces of the lower electrode 210 and the upper electrode 220. The first horizontal portion positioned above the lower electrode 210 and the second horizontal portion positioned below the upper electrode 220 extend in different directions in the cross-sectional view shown in FIG. 2. For example, referring to FIG. 2, in an exemplary embodiment, the columnar portion of the seal member 240 extends in a vertical direction, the first horizontal portion of the seal member 240 positioned above the lower electrode 210 extends away from the columnar portion horizontally in a direction toward the left, and the second horizontal portion of the seal member 240 position below the upper electrode 220 extends away from the columnar portion horizontally in a direction toward the right. One unit structure is divided based on the columnar portion of the seal member 240.

According to an exemplary embodiment, in the seal member 240, ends of the horizontal portions do not contact the columnar portion adjacent thereto, and openings 241 and 242 are positioned at the corresponding portions. Sizes of the openings 241 and 242 vary as the display device is bent. The degree of change of the openings 241 and 242 may be reduced by the compressive force of the electro-active polymer 230 caused by the electric field. As a result, a slip phenomenon that can potentially occur in the flexible display device may be prevented, and resulting interlayer separation may also be prevented, thereby improving reliability. Although the exemplary embodiment illustrated in FIG. 2 includes the openings 241 and 242, exemplary embodiments of the present invention are not limited thereto. For example, in an exemplary embodiment, no openings are formed. Whether openings are formed may be determined depending on the degree of bending of each layer and the characteristics of the material constituting each layer.

According to an exemplary embodiment, one seal member 240 illustrated in the cross-sectional view of FIG. 2 may have a structure extending along a direction substantially perpendicular to the cross-section (one direction in the front of the display device). According to an exemplary embodiment, additional openings may be positioned to connect electro-active polymers 230 adjacent thereto at a portion of the columnar portion of the seal member 240.

In the exemplary embodiment of FIG. 2, the two electrodes 210 and 220 are divided by the seal member 240 dividing the respective zones 200-1, 200-2, and 200-3. For example, although a same voltage is applied to the same zones 200-1, 200-2, and 200-3, different voltages may be applied to different zones 200-1, 200-2, and 200-3. For example, in an exemplary embodiment that includes two first zones 200-1 and two second zones 200-2, a first voltage may be applied to the two first zones 200-1, and a second voltage different from the first voltage may be applied to the two second zones 200-2. However, exemplary embodiments of the present invention are not limited thereto. For example, according to an exemplary embodiment, the seal member 240 does not divide at least one of the electrodes 210 and 220 such that a voltage is commonly applied thereto (see, e.g., the lower electrode 210 in the exemplary embodiment of FIG. 8 described below).

In an exemplary embodiment, the electrical actuation part 200 further includes non-conductive adhesive layers 250 and 260. The non-conductive adhesive layers 250 and 260 are positioned outside of the two electrodes 210 and 220, and thereby facilitate adhering the electrical actuation part 200 to a layer adjacent thereto.

The structure of such a unit structure is the same in the three zones 200-1, 200-2, and 200-3. However, widths of the unit structures included in the three zones 200-1, 200-2, and 200-3 are different from each other.

For example, according to the exemplary embodiment of FIG. 2, the unit structure of the first zone 200-1 has the largest width, the unit structure of the second zone 200-2 has the second largest width, and the unit structure of the third zone 200-3 has the narrowest width. According to an exemplary embodiment, the number of zones may vary to be two or more, and it is possible to have widths of various unit structures even within one area.

According to the exemplary embodiment of FIG. 2, the first zone 200-1 is positioned at an outermost side of the display device, the second zone 200-2 is positioned further away from the outermost side, and the third zone 200-3 is positioned near a center of the display device. For example, the third zone 200-3 may be positioned exactly at the center of the display device (e.g., the center of the display device may be aligned with the center of the third zone 200-3), or approximately at the center of the display device. Such a configuration is determined depending on a manner in which the display device is folded. For example, the display device according to the exemplary embodiment of FIGS. 1 and 2 has a structure that is folded around the center of the display device.

Figure 3:
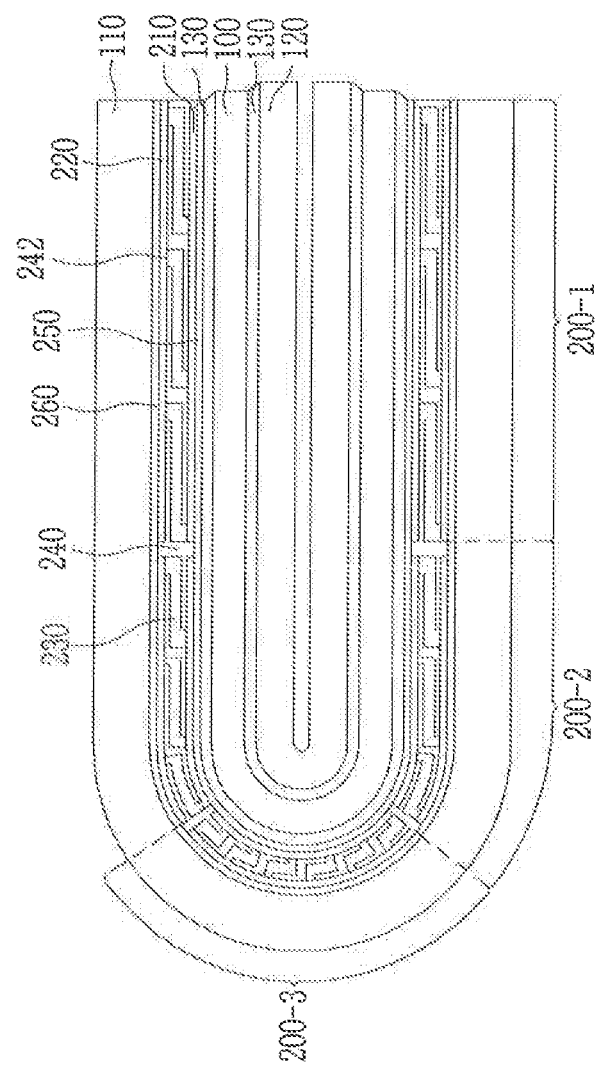
FIG. 3 illustrates a folded structure of a display device according to an exemplary embodiment of the present invention.

FIG. 3 illustrates a structure in which the display device according to the exemplary embodiment of FIGS. 1 and 2 is folded in an in-folding method.

FIG. 3 illustrates a folded structure of a display device according to an exemplary embodiment of the present invention.

Referring to FIG. 3, the display device is folded around the third zone 200-3 having the narrowest unit structure. This is because, as the width of the unit structure is narrower, the number of unit structures per area is larger, so that a tensile stress generated at the corresponding portion may be further alleviated.

The second zone 200-2 is positioned at opposite sides of the third zone 200-3, and the second zone 200-2 is positioned at a portion at which a degree of the bending of the display device is relatively small, and thus, the tensile stress is also relatively small. The first zone 200-1 is positioned at remaining portions. In the case of being folded as illustrated in FIG. 3, a tensile stress is hardly generated at a portion where the first zone 200-1 is positioned. Therefore, unlike the exemplary embodiment of FIG. 3, according to an exemplary embodiment, the first zone 200 may not include a unit structure.

When the display device is folded, a voltage is applied to the two electrodes 210 and 220. As a result, an electric field is generated to generate a compressive force in the electro-active polymer 230. In the case of being folded as illustrated in FIG. 3, a voltage may be applied thereto such that a greatest compressive force is provided in the third zone 200-3, and a voltage may be applied thereto such that a relatively small compressive force is provided in the second zone 200-2. Less compressive force may be provided in the first zone 200-1 than in the second zone 200-2.

FIG. 3 illustrates a structure in which a layer positioned at an inner side is slipped out when the display device is folded. This shows that, in such a structure, a PSA material used as the adhesive layer 130 may be flexible such that a layer adjacent to the adhesive layer 130 may be partially slipped. According to an exemplary embodiment, such slip does not occur. In addition, a degree of the slip may be changed depending on a characteristic of the adhesive layer 130, a characteristic of a layer adjacent to the adhesive layer 130, a compressive force applied to the electrical actuation part 200, etc.

Hereinafter, a stress characteristic depending on a compressive force generated in the electrical actuation part 200 will be described with reference to FIG. 4.

FIG. 4 illustrates an actuation characteristic of the display device according to the exemplary embodiment of FIGS. 1 and 2 and a stress applied to the display device.

The graph of FIG. 4 indicates stress generated in the case of being in-folded as illustrated (see also FIG. 3). In the graph, a dotted line indicates a case in which no compressive force is generated in the electrical actuation part 200, and a solid line indicates a case in which a compressive force is provided in the electrical actuation part 200. In the graph, a curve A at the top indicates a stress in the window 120, a curve B below the curve A indicates a stress in the display panel 100, and a curve C at the bottom indicates a stress at the base film 110. The graph of FIG. 4 indicates that a tensile stress is larger as it is positioned more toward a right side in the x-axis direction, and being positioned at an upper side in the y-axis direction indicates being positioned at an upper side of the display device.

Depending on the graph of FIG. 4, in the case of being in-folded, more stress occurs in the base film 110 positioned outwardly than in the window 120 positioned inwardly. The display panel 100 is positioned in a center, and thus, is subjected to stress corresponding to a middle level between the window 120 and the base film 110.

However, in an exemplary embodiment of the present invention, a compressive force is generated in the electro-active polymer 230 by applying a voltage to the electrical actuation part 200, thereby reducing the tensile stress (see ① and ② of FIG. 4). As a result, even when the display device is folded, a degree of change is reduced and less tensile stress occurs.

In the exemplary embodiment of FIGS. 1 and 2, in the case of being in-folded as illustrated in FIG. 3, since the tensile stress on the outer side (e.g., on the side of the base film 110) is greater, the electrical actuation part 200 is positioned between the display panel 100 and the base film 110. However, exemplary embodiments of the present invention are not limited thereto. For example, in an exemplary embodiment, the electrical actuation part 200 is positioned between the display panel 100 and the window 120. Thus, according to exemplary embodiments of the present invention, stress may be reduced as compared with a display device that does not include the electrical actuation part 200, and a phenomenon in which the window 120 is slipped may be prevented.

Hereinafter, a case of being out-folded according to an exemplary embodiment of the present invention will be described with reference to FIG. 5.

Figure 5:
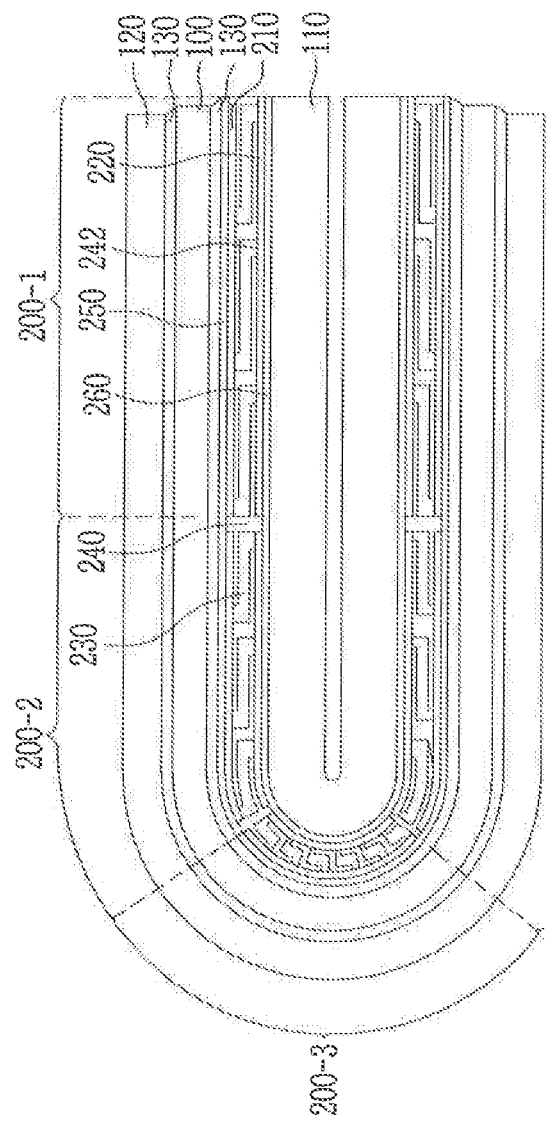
FIG. 5 illustrates a folded structure of a display device according to an exemplary embodiment of the present invention.

FIG. 5 illustrates a folded structure of a display device according to an exemplary embodiment of the present invention.

Unlike FIG. 3, which illustrates a structure in which the display device according to the exemplary embodiment of FIGS. 1 and 2 is in-folded, FIG. 5 illustrates a structure in which the display device according to the exemplary embodiment of FIGS. 1 and 2 is out-folded. Herein, the term "in-folded" refers to a display device being folded inward such that the display panel 100 is folded in toward itself, and is not visible when the display device is in the folded position. In contrast, the term "out-folded" refers to a display device being folded outward such that the display panel 100 is visible when the display device is in the folded position. Since the display device in FIG. 5 is out-folded, the image displayed in the display panel 100 may be viewed when the display device is in the folded position.

In FIG. 5, similar to FIG. 3, the display device is folded around the third zone 200-3. In addition, the second zone 200-2 is positioned at opposite sides of the third zone 200-3, and the second zone 200-2 is positioned at a portion where the degree of bending of the display device is relatively small such that the stress is reduced. The first zone 200-1 is positioned at remaining portions.

Even when the display device is out-folded as illustrated in FIG. 5, a voltage is applied to the two electrodes 210 and 220, so that an electric field is generated to generate a compressive force in the electro-active polymer 230. When the display device is out-folded, a voltage may be applied thereto such that a greatest compressive force is provided in the third zone 200-3, and a voltage may be applied thereto such that a relatively small compressive force is provided in the second zone 200-2. Less compressive force may be provided in the first zone 200-1 than in the second zone 200-2.

In the case of being out-folded as illustrated in FIG. 5, the electrical actuation part 200 does not directly reduce the tensile stress of the window 120, which is large. Rather, the electrical actuation part 200 indirectly reduces the stress of the window 120 through the display panel 100. In addition, the electrical actuation part 200 also serves to prevent an end of the base film 110 that is positioned inwardly from being slipped due to its narrow space by using the compressive force.

According to an exemplary embodiment, the electrical actuation part 200 is positioned at opposite sides of the display panel 100. Such an exemplary embodiment will be described later with reference to FIG. 16.

The display panel 100 according to exemplary embodiments of the present invention may have various structures, and a typical layered structure thereof will be described with reference to FIGS. 6A and 6B.

Figure 6A:
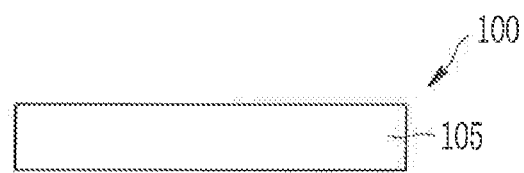
FIGS. 6A and 6B illustrate an example of a display panel that is applicable to exemplary embodiments of the present invention.
Figure 6B:
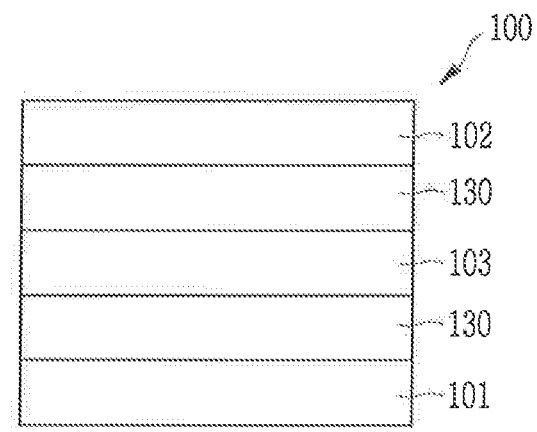

FIGS. 6A and 6B illustrate an example of a display panel that is applicable to exemplary embodiments of the present invention.

The display panel 100 used in the display device may have various structures. FIGS. 6A and 6B illustrate a cross-sectional structure of two display panels 100 including a touch sensing function.

FIG. 6A illustrates an integrated display panel 105 in which components enabling a touch sensing function and an image display function are formed on one panel. For example, a touch sensing electrode pattern may be formed on a common electrode of an organic light emitting display device to form both a touch sensing function and an image display function together in one panel. In a case in which the touch panel and the display panel are integrally formed as described above, there is an advantage that the number of layers to be formed is small and factors to be considered for the tensile stress generated between the layers are reduced.

FIG. 6B illustrates a display panel 100 in which a polarizing plate 103 and a touch panel 102 are formed at an upper portion of an organic light emitting display panel 101 that displays an image. The adhesive layer 130 is positioned between the display panel 101 and the polarizing plate 103, as well as between the polarizing plate 103 and the touch panel 102. Various adhesives may be used as the adhesive layer 130, and a pressure sensitive adhesive (PSA) may be used to relieve the display panel 100, the window 120, and the base film 110 when they are subjected to different stresses due to bending in the flexible display device. The structure of FIG. 6B has more factors to be considered for the tensile stress between layers when bent as compared with the structure of FIG. 6A, but has a low manufacturing cost and/or a less complicated manufacturing process. Accordingly, the selection of the structures shown in FIGS. 6A and 6B may be determined depending on the situation in which display panel 100 is used.

The flexible display device generally uses a display panel including an organic light emitting element. However, the flexible display device is not limited thereto. For example, a liquid crystal panel may be used depending on the situation. To use a liquid crystal display panel as a flexible display panel, a special structure is utilized such that the liquid crystal layer is formed in each microcavity for each pixel so that the retardation does not change even if it is bent.

An electrode structure of the electrical actuation part 200 according to an exemplary embodiment of the present invention will now be described with reference to FIGS. 7 to 10.

Figure 7:
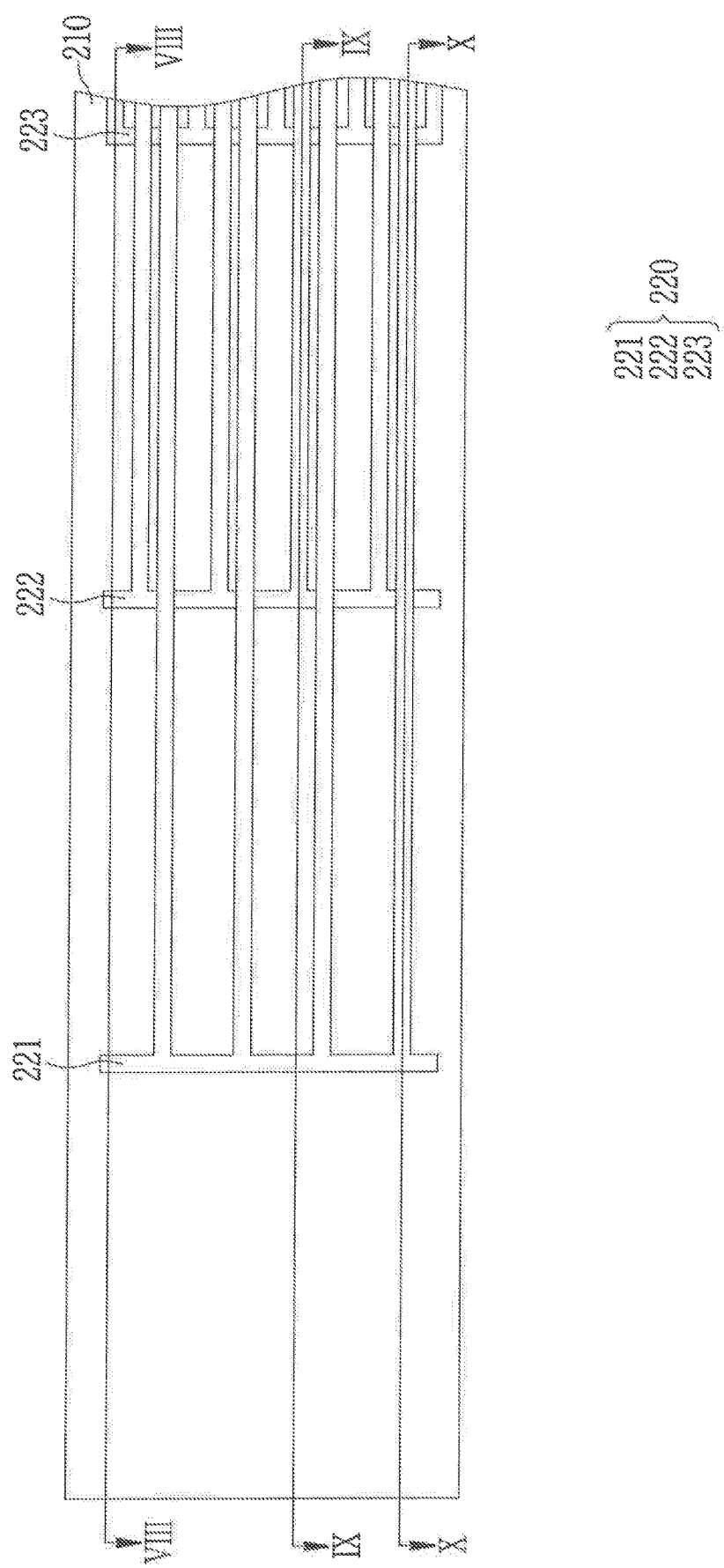
FIG. 7 is a bottom view illustrating an electrical actuation part according to an exemplary embodiment of the present invention.
Figure 8:
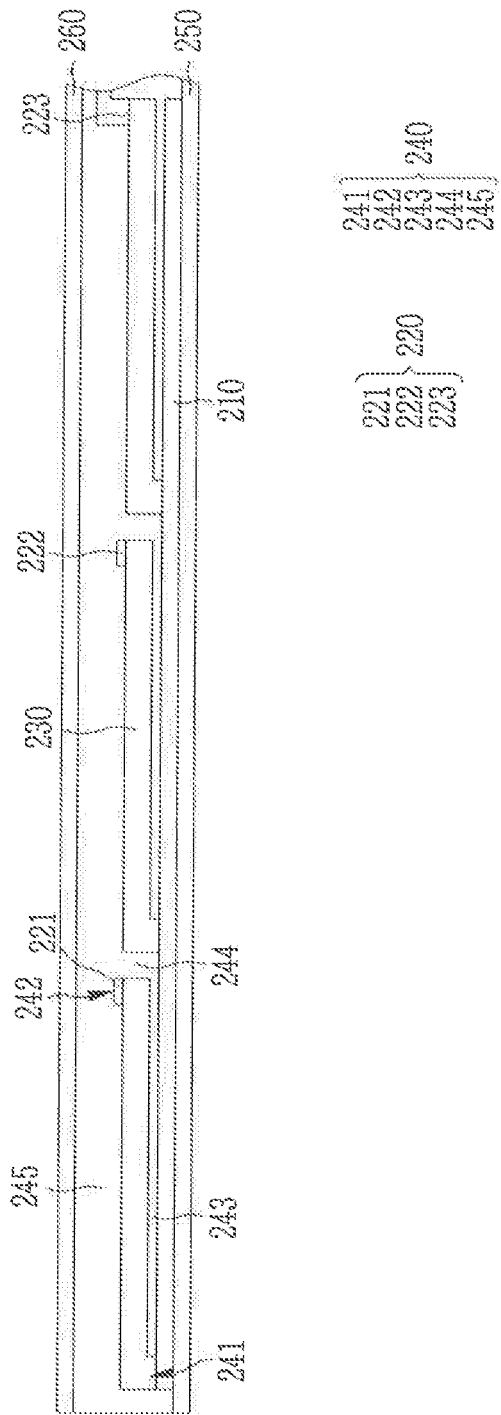
FIGS. 8 to 10 are cross-sectional views illustrating the electrical actuation part of FIG. 7.
Figure 9:
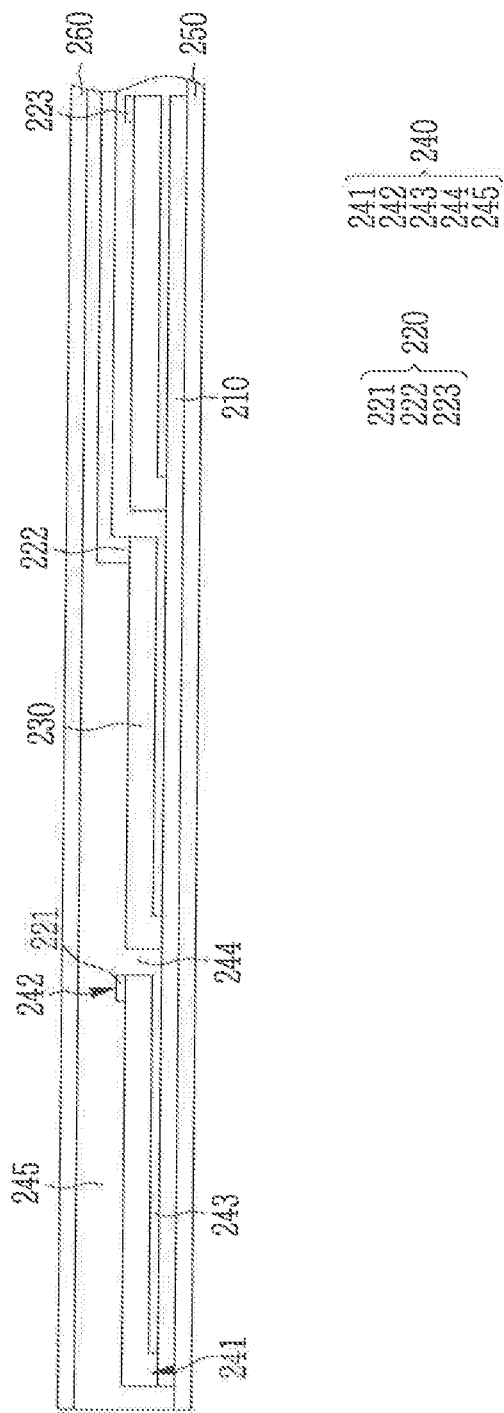
Figure 10:
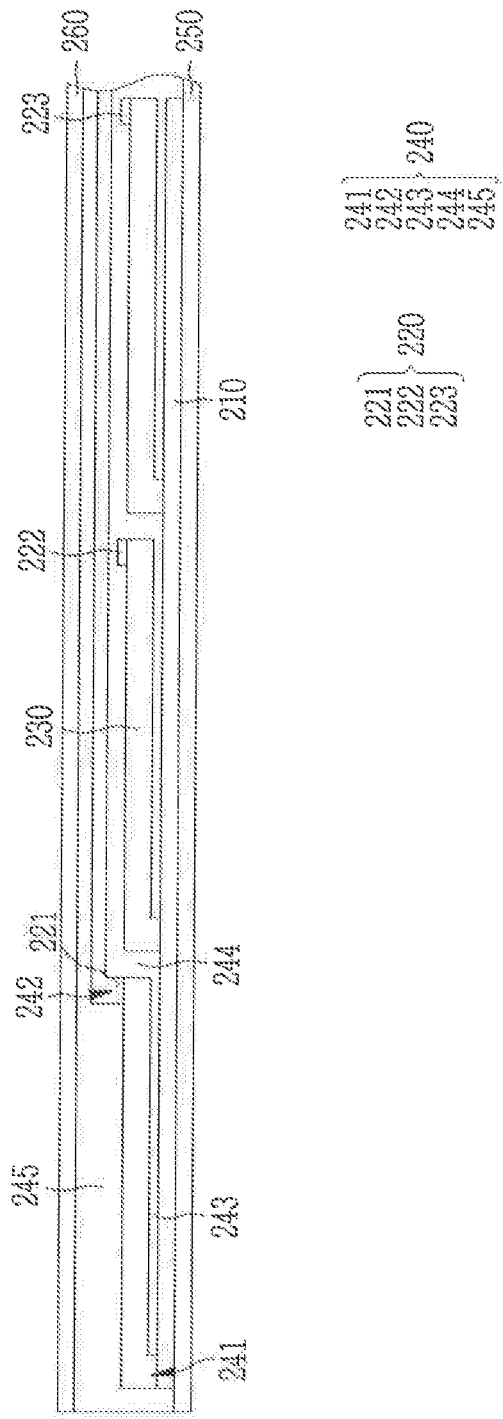

FIG. 7 is a bottom view illustrating an electrical actuation part according to an exemplary embodiment of the present invention. FIGS. 8 to 10 are cross-sectional views illustrating the electrical actuation part of FIG. 7. In FIG. 7, line VIII-VIII corresponds to the cross-sectional view illustrated in FIG. 8, line IX-IX corresponds to the cross-sectional view illustrated in FIG. 9, and line X-X corresponds to the cross-sectional view illustrated in FIG. 10.

According to the exemplary embodiment of FIGS. 7 to 10, an upper electrode 220 of the electrical actuation part 200 includes a first upper electrode 221, a second upper electrode 222, and a third upper electrode 223. The lower electrode 210 may have one plate-like electrode structure electrically connected thereto.

In FIG. 7, the first upper electrode 221 includes one vertical portion and a plurality of horizontal portions extending from the one vertical portion. Each of the second upper electrode 222 and the third upper electrode 223 also includes one vertical portion and a plurality of horizontal portions extending from the vertical portion. The horizontal portions of the first to third upper electrodes 221, 222, and 223 extend substantially parallel to one another and do not overlap one another. For example, as shown in FIG. 7, the uppermost horizontal portion of the first upper electrode 221 is disposed below the uppermost horizontal portion of the second upper electrode 222, and the uppermost horizontal portion of the second upper electrode 222 is disposed below the uppermost horizontal portion of the third upper electrode 223. In FIGS. 7 to 10, the horizontal portions of the first upper electrode 221 cross the vertical portion of the second upper electrode 222 and the vertical portion of the third upper electrode 223 while being insulated therefrom, and the horizontal portions of the second upper electrode 222 cross the vertical portion of the third upper electrode 223 while being insulated therefrom. An upper horizontal portion 245 of the seal member 240 is used to provide insulation to the structure in which the vertical portion and the horizontal portion cross each other. Hereinafter, a structure of each unit structure will be described in detail with reference to FIGS. 8 to 10.

One unit structure includes two electrodes 210 and 220 that are vertically positioned, and an electro-active polymer 230 positioned therebetween. The upper electrode 220 includes the first to third upper electrodes 221, 222, and 223 that are electrically separated from one another. According to an exemplary embodiment, the upper electrode 220 may include at least four electrically isolated electrodes. The lower electrode 210 generally has a single plate-like structure. A characteristic of the electro-active polymer 230 is changed by an electric field generated by the lower electrode 210 and the upper electrode 220. In the exemplary embodiment of FIGS. 7 to 10, a compressive force is increased in a left-right direction. As a result, the electrical actuation part 200 reduces a tensile stress of the left-right direction generated by bending the display device.

The electrical actuation part 200 may further include the seal member 240. The seal member 240 divides unit structures. The seal member 240 partitions the electro-active polymer 230. For this purpose, the seal member 240 includes a columnar portion 244 and horizontal portions 243 and 245 extended from the columnar portion 244 along surfaces of the lower electrode 210 and the upper electrode 220. The lower horizontal portion 243 positioned below the lower electrode 210 and the upper horizontal portion 245 positioned below the upper electrode 220 extend in different directions based on the columnar portion 244. In addition, the lower opening 241 is positioned at an end of the lower horizontal portion 243, and the upper opening 242 is positioned at an end of the upper horizontal portion 245. In the seal member 240, the ends of the horizontal portions 243 and 245 do not contact the columnar portion 244 adjacent thereto, and the openings 241 and 242 are positioned at corresponding portions.

In the exemplary embodiment of FIGS. 7 to 10, one of the first to third upper electrodes 221, 222, and 223 is formed in the upper opening 242. As a result, a structure in which the vertical portion is positioned in the upper opening 242, the upper horizontal portion 245 is positioned thereabove, and the horizontal portions of the first to third upper electrodes 221, 222, and 223 extend thereon, is realized.

In FIG. 9, it is illustrated that the horizontal portion of the second upper electrode 222 and the vertical portion of the third upper electrode 223 cross each other at a rightmost portion of the upper opening 242. In FIG. 9, the vertical portion of the third upper electrode 223 positioned on the upper opening 242 is formed to have a structure in which the upper horizontal portion 245 is positioned thereon, and the horizontal portion of the second upper electrode 222 extends thereon. Accordingly, the second upper electrode 222 and the third upper electrode 223 are insulated from each other.

In FIG. 10, it is illustrated that the first upper electrode 221 crosses the second upper electrode 222 and the third upper electrode 223 at a rightmost portion of the upper opening 242 while being insulated therefrom. In FIG. 10, a structure in which the upper horizontal portion 245 is positioned on the vertical portion of the second upper electrode 222 positioned in the upper opening 242 and the vertical portion of the third upper electrode 223, which are different from each other, and the horizontal portion of the first upper electrode 221 extends thereon. Accordingly, the first upper electrode 221 crosses the second upper electrode 222 and third upper electrode 223 while being insulated therefrom.

According to an exemplary embodiment, electrodes may be formed so as to be insulated from each other without forming an electrode in the upper opening 242. In this case, the upper horizontal portion 245 may insulate the two electrodes that cross each other.

Sizes of the openings 241 and 242 vary as the display device is bent, and the degree of change of the openings 241 and 242 may be reduced by the compressive force of the electro-active polymer 230 due to the electric field. As a result, the slip phenomenon occurring in the flexible display device may be prevented, and resulting interlayer separation may also be prevented, thereby improving the reliability of the flexible display device.

The electrical actuation part 200 may further include non-conductive adhesive layers 250 and 260. The non-conductive adhesive layers 250 and 260 are positioned outside the two electrodes 210 and 220, and facilitate adhering the electrical actuation part 200 to a layer adjacent thereto.

In the exemplary embodiment of FIGS. 7 to 10, a structure in which the upper electrode 220 of the electrical actuation part 200 is divided into 3 parts is exemplified, and the electrical actuation part 200 of FIG. 2 includes three zones 200-1, 200-2, and 200-3. However, exemplary embodiments of the present invention are not limited thereto. For example, in an exemplary embodiment, the three upper electrodes 221, 222, and 223 may have a one-to-one correspondence with the three zones 200-1, 200-2, and 200-3. For example, the first upper electrode 221 may serve as an upper electrode of the first zone 200-1, the second upper electrode 222 may serve as an upper electrode of the second zone 200-2, and the third upper electrode 223 may serve as an upper electrode of the third zone 200-3. Further, in an exemplary embodiment, the three upper electrodes 221, 222, and 223 may be used as upper electrodes in any one of the first to third zones 200-1, 200-2, and 200-3.

Hereinafter, an exemplary embodiment of the present invention will be described with reference to FIGS. 11 to 13.

First, an electrical actuation part 200 according to an exemplary embodiment will be described with reference to FIG. 11.

Figure 11:
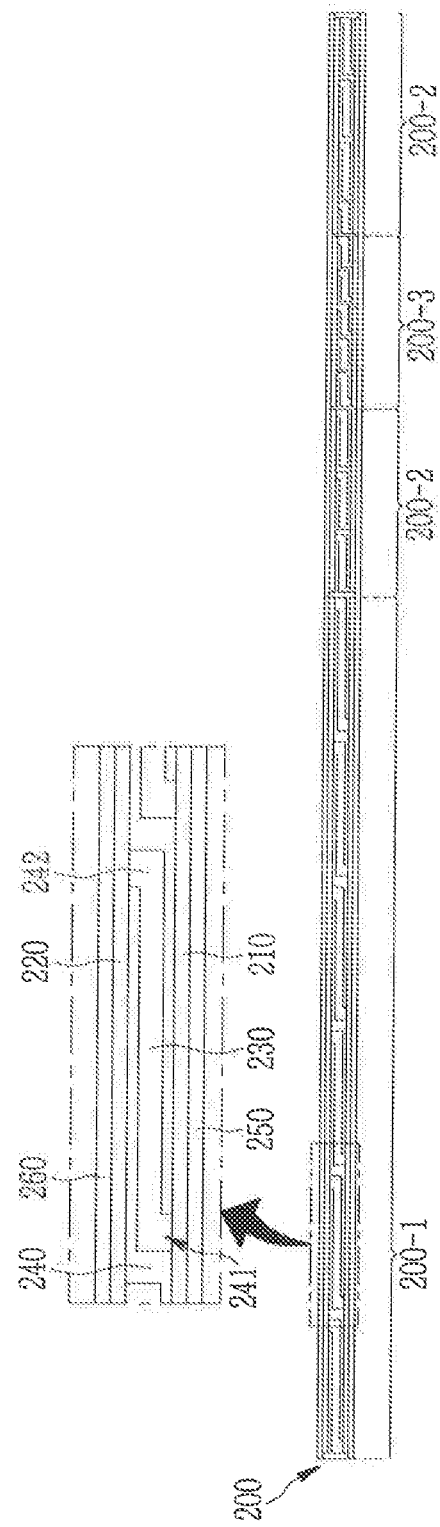
FIG. 11 is an enlarged cross-sectional view illustrating an electrical actuation part according to an exemplary embodiment of the present invention.

FIG. 11 is an enlarged cross-sectional view illustrating an electrical actuation part 200 according to an exemplary embodiment of the present invention.

The electrical actuation part 200 of FIG. 11 includes three zones 200-1, 200-2, and 200-3, similar to the electrical actuation part of FIG. 2. However, the electrical actuation part 200 of FIG. 11 is different from the electrical actuation part of FIG. 2 in positions of the three zones 200-1, 200-2, and 200-3.

The electrical actuation part 200 of FIG. 11 is divided into three zones 200-1, 200-2, and 200-3. Each of the three zones 200-1, 200-2, and 200-3 has a structure in which one unit structure having a same shape is repeatedly configured. In addition, the only difference between the three zones 200-1, 200-2, and 200-3 is the size of the unit structure. Otherwise, the structure of the three zones 200-1, 200-2, and 200-3 is the same.

FIG. 11 enlarges and illustrates a unit structure of the first zone 200-1, and each unit structure of the three zones 200-1, 200-2, and 200-3 has a following structure.

One unit structure includes two electrodes 210 and 220 that are vertically positioned, and an electro-active polymer 230 positioned therebetween. A characteristic of the electro-active polymer 230 is changed by an electric field generated by the lower electrode 210 and the upper electrode 220. In the exemplary embodiment of FIGS. 11 to 13, a compressive force is increased in a left-right direction. As a result, the electrical actuation part 200 reduces a tensile stress of the left-right direction generated by bending the display device.

The electrical actuation part 200 may further include the seal member 240. The seal member 240 divides unit structures. The seal member 240 partitions the electro-active polymer 230. For this purpose, the seal member 240 includes a columnar portion and horizontal portions extended from the columnar portion along surfaces of the lower electrode 210 and the upper electrode 220. According to the exemplary embodiment of FIGS. 11 to 13, in the seal member 240, ends of the horizontal portions do not contact the columnar portion adjacent thereto, and openings 241 and 242 are positioned at the corresponding portions.

Sizes of the openings 241 and 242 vary as the display device is bent. The degree of change of the openings 241 and 242 may be reduced by the compressive force of the electro-active polymer 230 due to the electric field. As a result, the slip phenomenon occurring in the flexible display device may be prevented, and resulting interlayer separation may also be prevented, thereby improving the reliability of the flexible display device. Although the exemplary embodiment of FIGS. 11 to 13 includes the openings 241 and 242, exemplary embodiments of the present invention are not limited thereto. For example, in an exemplary embodiment, no openings are formed.

One seal member 240 may have a structure extending along a direction substantially perpendicular to the cross-section.

According to an exemplary embodiment, an additional opening is positioned to interconnect the electro-active polymers 230 adjacent to a part of the columnar portion of the seal member 240.

The electrical actuation part 200 may further include the non-conductive adhesive layers 250 and 260. The non-conductive adhesive layers 250 and 260 are positioned outside the two electrodes 210 and 220 and facilitate adhering the electrical actuation part 200 to a layer adjacent thereto.

The structure of such a unit structure is the same in the three zones 200-1, 200-2, and 200-3. However, widths of the unit structures included in the three zones 200-1, 200-2, and 200-3 are different from one another.

For example, in an exemplary embodiment, the unit structure of the first zone 200-1 has the largest width, the unit structure of the second zone 200-2 has the second largest width, and the unit structure of the third zone 200-3 has the narrowest width. According to an exemplary embodiment, the number of zones may vary to be two or more, and it is possible to have widths of various unit structures even within one area.

According to the exemplary embodiment of FIG. 11, the first zone 200-1 is positioned at an outermost side of the display device, the second zone 200-2 is positioned further away from the outermost side, and the third zone 200-3 is positioned near a center of the display device. The second zone 200-2 is also positioned at a right side of the third zone 200-3. Such a configuration is determined depending on a manner in which the display device is folded. For example, the electrical actuation part 200 of FIG. 11 may be used in a display device in which a right side thereof is folded.

Figure 12:
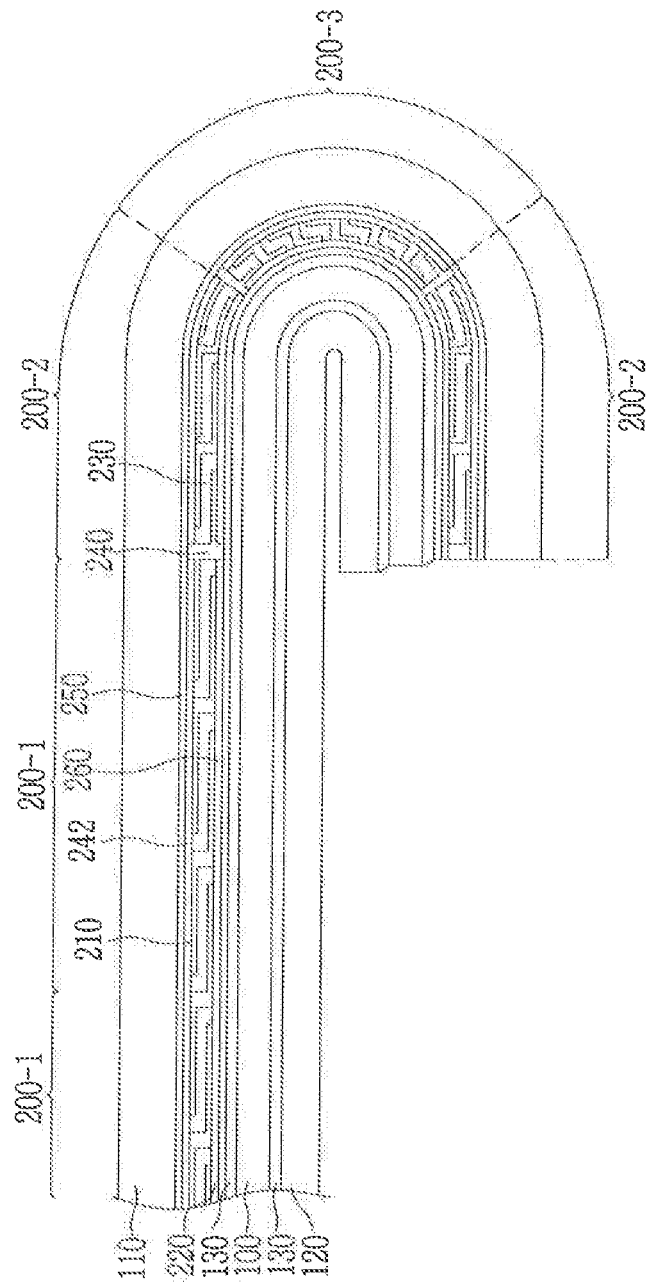
FIG. 12 illustrates a folded structure of a display device using the electrical actuation part of FIG. 11.

FIG. 12 illustrates a structure in which the display device using the electrical actuation part of FIG. 11 is folded in an in-folding method.

FIG. 12 illustrates a folded structure of a display device using the electrical actuation part of FIG. 11.

Referring to FIG. 12, the display device is folded around the third zone 200-3 having the narrowest unit structure. This is because, as the width of the unit structure is narrower, the number of unit structures per area is larger, so that a tensile stress generated at the corresponding portion may be further alleviated.

The second zone 200-2 is positioned at opposite sides of the third zone 200-3, and the second zone 200-2 is positioned at a portion at which a degree of the bending of the display device is relatively small, and thus, the tensile stress is also relatively small. The first zone 200-1 is positioned at remaining portions, and the first zone 200-1 is not positioned at a side of the electrical actuation part 200. In the case of being folded as illustrated in FIG. 12, a tensile stress is hardly generated at a portion where the first zone 200-1 is positioned. Therefore, unlike the exemplary embodiment of FIG. 12, according to an exemplary embodiment, the first zone 200-1 may not include a unit structure.

When the display device is folded, a voltage is applied to the two electrodes 210 and 220. As a result, an electric field is generated to generate a compressive force in the electro-active polymer 230. In the case of being folded as illustrated in FIG. 12, a voltage may be applied thereto such that a greatest compressive force is provided in the third zone 200-3, and a voltage may be applied thereto such that a relatively small compressive force is provided in the second zone 200-2. Less compressive force may be provided in the first zone 200-1 than in the second zone 200-2.

In the case of being in-folded as illustrated in FIG. 12, more stress occurs in the base film 110 positioned outwardly than in the window 120 positioned inwardly. The display panel 100 is positioned in a center, and thus is subjected to an amount of stress that is between the amount of stress subjected to the window 120 and the base film 110.

Figure 13:
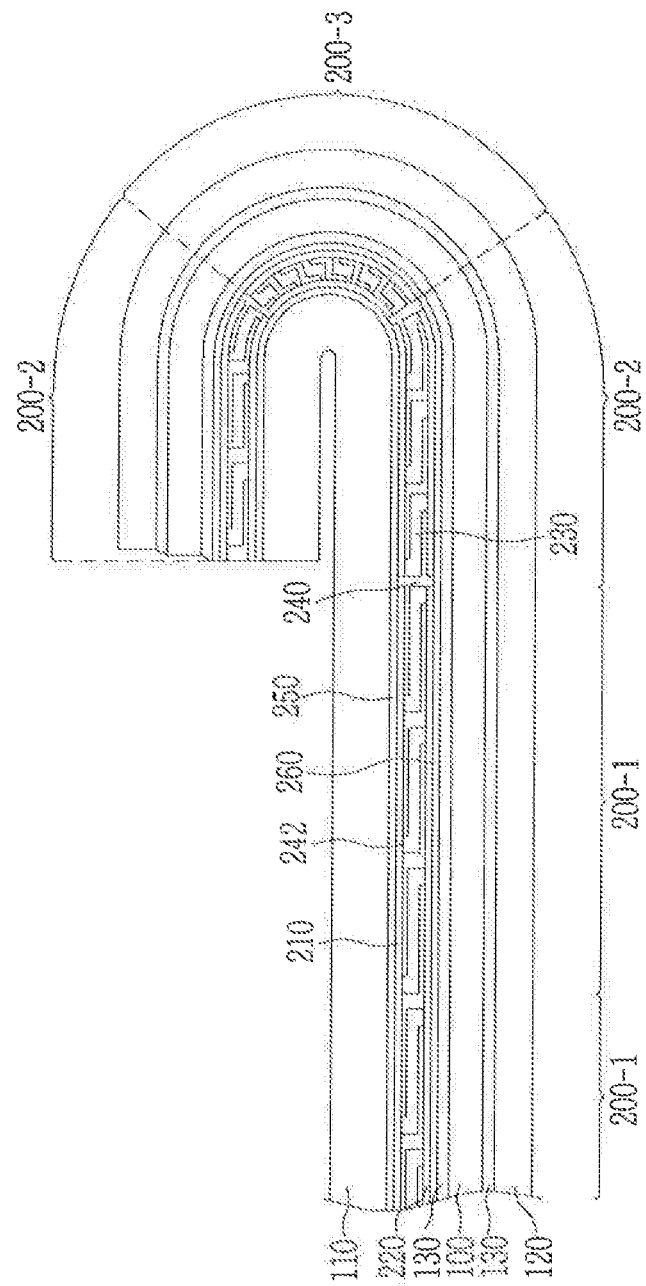
FIG. 13 illustrates a folded structure of the display device using the electrical actuation part of FIG. 11.

However, in the exemplary embodiment of FIGS. 11 to 13, a compressive force is generated in the electro-active polymer 230 by applying a voltage to the electrical actuation part 200, thereby reducing the tensile stress. As a result, even when the display device is folded, a degree of change is reduced and less tensile stress is received.

In the case of being in-folded as illustrated in FIG. 12, since the tensile stress on the outer side (e.g., on the side of the base film 110) is greater, the electrical actuation part 200 is positioned between the display panel 100 and the base film 110. However, exemplary embodiments of the present invention are not limited thereto. For example, in an exemplary embodiment, the electrical actuation part 200 may be positioned between the display panel 100 and the window 120. Thus, according to exemplary embodiments of the present invention, stress may be reduced as compared with a display device that does not include the electrical actuation part 200, and a phenomenon in which the window 120 is slipped may be prevented.

In FIG. 12, the display device is folded by using an in-folding method such that a portion that displays images is positioned inside the display device. However, exemplary embodiments of the present invention are not limited thereto. For example, according to an exemplary embodiment, the display device is folded by using an out-folding method, which is illustrated in FIG. 13.

FIG. 13 illustrates a differently folded structure of the display device using the electrical actuation part of FIG. 11.

FIG. 13 illustrates an out-folding structure. Since the display device is out-folded, an image displayed by the display panel 100 may be viewed in a folded state.

In FIG. 13, similar to FIG. 12, the display device is folded around the third zone 200-3. In addition, the second zone 200-2 is positioned at opposite sides of the third zone 200-3, and the second zone 200-2 is positioned at a portion where the degree of bending of the display device is relatively small such that the stress is reduced. The first zone 200-1 is positioned at remaining portions, and the first zone 200-1 is positioned only at one side of the electrical actuation part 200.

Even when the display device is out-folded as illustrated in FIG. 13, a voltage is applied to the two electrodes 210 and 220. As a result, an electric field is generated to generate a compressive force in the electro-active polymer 230. When the display device is out-folded, a voltage may be applied thereto such that a greatest compressive force is provided in the third zone 200-3, and a voltage may be applied thereto such that a relatively small compressive force is provided in the second zone 200-2. Less compressive force may be provided in the first zone 200-1 than in the second zone 200-2.

In the case of being out-folded as illustrated in FIG. 13, the electrical actuation part 200 does not directly reduce the tensile stress of the window 120, which is large. Rather, the electrical actuation part 200 indirectly reduces the stress of the window 120 through the display panel 100. In addition, the electrical actuation part 200 also serves to prevent an end of the base film 110 that is positioned inwardly from being slipped due to its narrow space by using the compressive force.

According to an exemplary embodiment, the electrical actuation part 200 is positioned at opposite sides of the display panel 100. Such an exemplary embodiment will be described later with reference to FIG. 16.

Hereinafter, an exemplary embodiment of the present invention will be described with reference to FIGS. 14 and 15.

First, an electrical actuation part 200 according to the exemplary embodiment of FIGS. 14 and 15 will be described with reference to FIG. 14.

Figure 14:
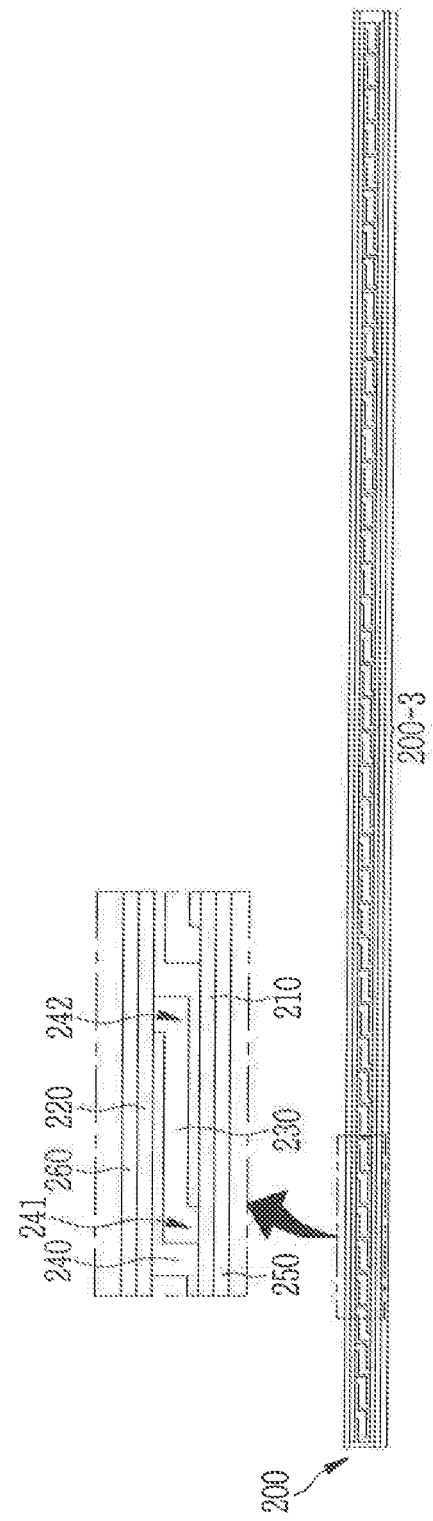
FIG. 14 is an enlarged cross-sectional view illustrating an electrical actuation part according to an exemplary embodiment of the present invention.

FIG. 14 is an enlarged cross-sectional view illustrating an electrical actuation part according to an exemplary embodiment of the present invention.

The electrical actuation part 200 of FIG. 14 includes only one zone 200-3, unlike the electrical actuation part of FIGS. 2 and 11. The electrical actuation part 200 of FIG. 14 may be used when the same or similar tensile stress is applied throughout the electrical actuation part 200.

The electrical actuation part 200 of FIG. 14 includes only one zone 200-3, and one unit structure having a same shape and a same width is repeatedly formed.

The unit structure used in the electrical actuation part 200 of FIG. 14 is enlarged and illustrated, and has a following structure.

One unit structure includes two electrodes 210 and 220 that are vertically positioned, and an electro-active polymer 230 positioned therebetween. A characteristic of the electro-active polymer 230 is changed by an electric field generated by the lower electrode 210 and the upper electrode 220. In the exemplary embodiment illustrated in FIG. 14, a compressive force is increased in a left-right direction. As a result, the electrical actuation part 200 reduces a tensile stress of the left-right direction generated by bending the display device.

The electrical actuation part 200 may further include a seal member 240. The seal member 240 divides unit structures. The seal member 240 partitions the electro-active polymer 230. For this purpose, the seal member 240 includes a columnar portion and horizontal portions extended from the columnar portion along surfaces of the lower electrode 210 and the upper electrode 220. According to the exemplary embodiment illustrated in FIG. 14, in the seal member 240, ends of the horizontal portions do not contact the columnar portion adjacent thereto, and openings 241 and 242 are positioned at the corresponding portions.

Sizes of the openings 241 and 242 vary as the display device is bent, and the degree of change of the openings 241 and 242 may be reduced by the compressive force of the electro-active polymer 230 due to the electric field. As a result, the slip phenomenon occurring in the flexible display device may be prevented, and resulting interlayer separation may also be prevented, thereby improving the reliability of the flexible display device.

One seal member 240 may have a structure extending along a direction substantially perpendicular to the cross-section. According to an exemplary embodiment, an additional opening is positioned to interconnect the electro-active polymers 230 adjacent to a part of the columnar portion of the seal member 240.

The electrical actuation part 200 may further include non-conductive adhesive layers 250 and 260. The non-conductive adhesive layers 250 and 260 are positioned outside the two electrodes 210 and 220, and facilitate adhering the electrical actuation part 200 to a layer adjacent thereto.

Figure 15:
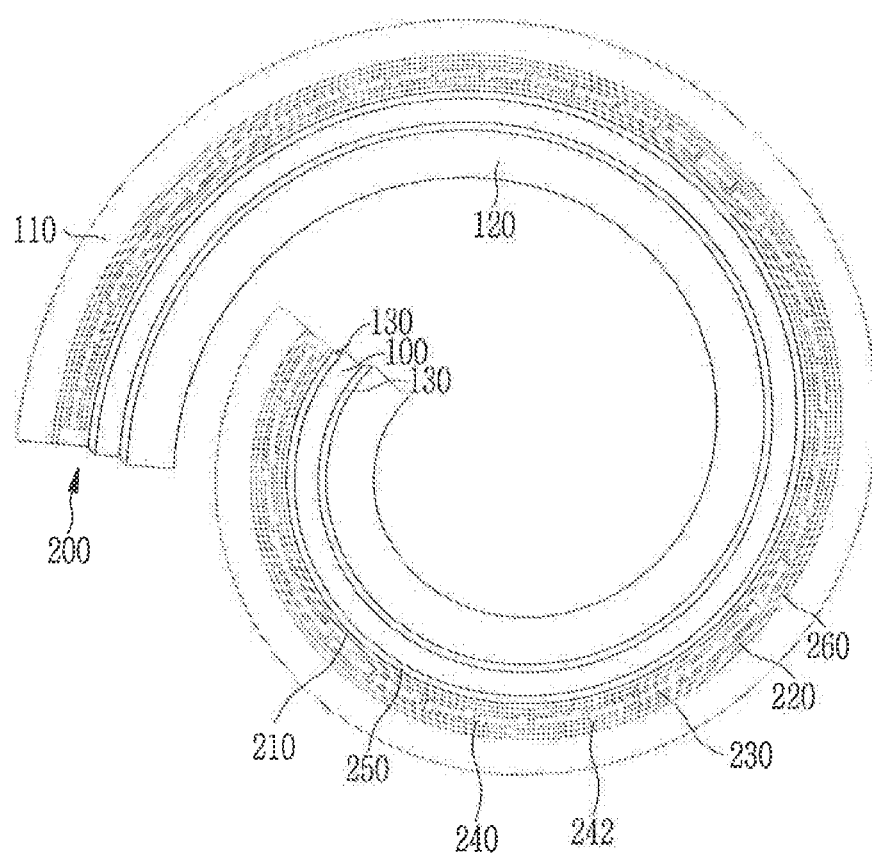
FIG. 15 illustrates a rolled structure of the electrical actuation part of FIG. 14.

FIG. 15 illustrates a structure in which the display device using the electrical actuation part of FIG. 14 is folded by an in-folding method.

FIG. 15 illustrates a rolled structure of the electrical actuation part of FIG. 14.

The electrical actuation part 200 of FIG. 14 may include only a unit structure of a same width to bend the display device in the case of receiving the same or similar tensile stress. For example, as illustrated in FIG. 15, the display device may be rolled. Accordingly, the display device may be referred to as a rollable display device.

In FIG. 15, the display device is rolled in an in-folding method. As a result, the image displayed on the display panel 100 may not be viewed from the outside. However, the display device may also be rolled in an out-folding method.

Since the electrical actuation part 200 of FIG. 14 is formed only of a unit structure having a narrow width, the display device may be folded around a center thereof as illustrated in FIGS. 3 and 5, or may be folded around one side thereof as illustrated in FIGS. 12 and 13. In addition, the display device may be folded or bent in various other ways.

When the display device including the electrical actuation part 200 of FIG. 14 is folded, a voltage is applied to the two electrodes 210 and 220. As a result, an electric field is generated to generate a compressive force in the electro-active polymer 230. In the case of being folded as illustrated in FIG. 15, a voltage is applied such that a same or similar compressive force is provided.

When the display device is rolled, in the case of being in-folded (FIG. 15), more stress occurs in the base film 110 positioned outwardly than in the window 120 positioned inwardly. The display panel 100 is positioned at a center, and thus, is subjected to an amount of stress that is between the amount of stress the window 120 and the base film 110 are subjected to.

However, in the exemplary embodiment of FIGS. 14 and 15, a compressive force is generated in the electro-active polymer 230 by applying a voltage to the electrical actuation part 200, thereby reducing the tensile stress. As a result, even when the display device is folded, a degree of change is reduced and less tensile stress occurs.

In the case of being in-folded as illustrated in FIG. 15, since the tensile stress on the outer side (e.g., on the side of the base film 110) is greater, the electrical actuation part 200 is positioned between the display panel 100 and the base film 110. However, exemplary embodiments of the present invention are not limited thereto. For example, in an exemplary embodiment, the electrical actuation part 200 may be positioned between the display panel 100 and the window 120. Thus, according to exemplary embodiments of the present invention, stress may be reduced as compared with a display device that does not include the electrical actuation part 200, and a phenomenon in which the window 120 is slipped may be prevented.

According to an exemplary embodiment, the display device may be folded in an out-folding method. In addition, according to an exemplary embodiment, the electrical actuation part 200 may be positioned at opposite sides of the display panel 100.

Hereinafter, a structure in which the electrical actuation part 200 is positioned at opposite sides of the display panel 100 will be described with reference to FIG. 16.

Figure 16:
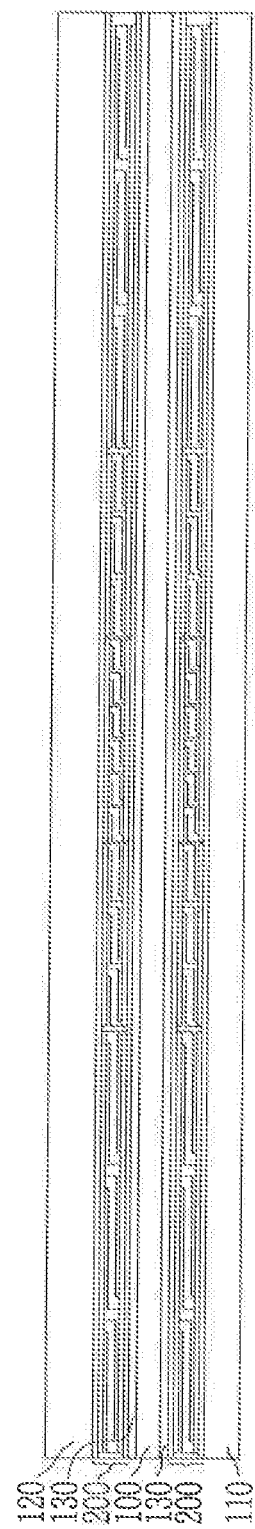
FIG. 16 is a cross-sectional view illustrating a display device according to an exemplary embodiment of the present invention.

FIG. 16 is a cross-sectional view illustrating a display device according to an exemplary embodiment of the present invention.

In the exemplary embodiment of FIG. 16, the electrical actuation part 200 is the same as that of the exemplary embodiment of FIG. 1. However, unlike in FIG. 1, the electrical actuation part 200 is positioned at opposite sides of the display panel 100.

Unlike in FIG. 16, the electrical actuation part 200 of FIGS. 11 and 14 may be used as the electrical actuation part 200 and may be positioned at opposite sides of the display panel 100. In addition, unit structures of the two electrical actuation parts 200 may have different structures. For example, in an exemplary embodiment, the electrical actuation part of FIG. 1 and the electrical actuation part of FIG. 14 may be provided together in one display device. In addition, although electrical actuation parts having the same structures are used, an exemplary embodiment in which the electrical actuation parts have unit structure having different sizes may also be implemented.

Various voltages may be applied to the two electrodes 210 and 220 positioned in the two electrical actuation parts 200. For example, even when two electrical actuation parts 200 included in one display device have the same structure, the compressive force may be varied depending on positions by applying different voltages to the two electrodes 210 and 220 of outer and inner electrical actuation parts 200 according to a folded direction.

In FIG. 1, since the electrical actuation part 200 is positioned at one side of the display panel 100, the compressive force of the electrical actuation part 200 is not directly applied to the window 120 positioned at the other side of the display panel 100. However, in the exemplary embodiment of FIG. 16, the window 120 is also directly applied with the compressive force of the electrical actuation part 200. As a result, further improved effects of reducing tensile stress and the slip phenomenon may be provided, thereby reducing interlayer separation, as described with reference to the graph of FIG. 17.

FIG. 17 illustrates an actuation characteristic of the display device according to the exemplary embodiment of FIG. 16 and a stress applied to the display device.

FIG. 17 is a graph illustrating the stress generated when in-folding or out-folding is performed. In the graph, a dot-dash line indicates a case in which the electrical actuation part 200 is not provided, a dotted line indicates a case in which the electrical actuation part 200 is formed at one side as illustrated in FIG. 1, and a solid line indicates a case in which the electrical actuation part 200 is formed at opposite sides of the display panel 100 as illustrated in FIG. 16. In the graph, a first curve at the top indicates the stress in the window 120, a second curve below the first curve indicates the stress in the display panel 100, and a third curve at the bottom indicates the stress at the base film 110. In the graph of FIG. 17, being positioned on the right side in the x-axis indicates that the tensile stress is large, and being positioned on the y-axis indicates being positioned at an upper portion in the display device.

As can be seen from the graph of FIG. 17, the compressive force provided by the two electrical actuation parts 200 provides a further improved stress reduction effect.

Further, since the electrical actuation part 200 is positioned at opposite sides of the display panel 100, there is an effect of reducing stress in both in-folding and out-folding methods.

As a result, even when the display device is folded, the degree of change is reduced, and the tensile stress is reduced. As a result, the slip phenomenon may be prevented, and thus, the interlayer separation may be reduced.

Unlike as illustrated in FIG. 16, an exemplary embodiment in which a pair of electrical actuation parts 200 of FIG. 11 or FIG. 14 are positioned at opposite sides of the display panel 100 may be applied thereto. In this case, a further improved tensile stress reduction effect may be provided, thereby improving reliability.

Hereinafter, an exemplary embodiment in which the display device further includes a strain gauge layer 150 will be described with reference to FIGS. 18 to 20.

Figure 18:
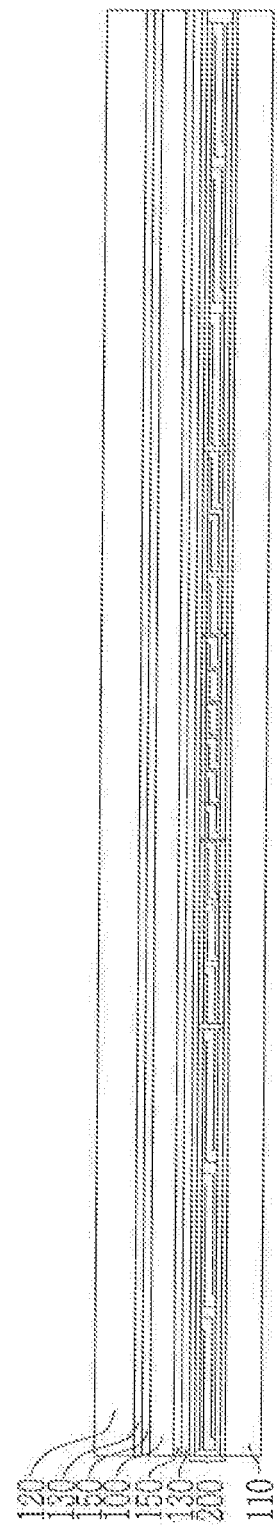
FIG. 18 illustrates a cross-sectional view illustrating a display panel according to the exemplary embodiments of the present invention.

FIG. 18 illustrates a cross-sectional view illustrating the display panel according to an exemplary embodiment of the present invention.

In the exemplary embodiment of FIG. 18, a structure including a pair of strain gauge layers 150 positioned at opposite sides of the display panel 100 in addition to the exemplary embodiment of FIG. 1 is illustrated.

In FIG. 18, the strain gauge layers 150 are attached to opposite side surfaces of the display panel 100, and an adhesive layer 130 is positioned at an outer side of each of the strain gauge layers 150.

The strain gauge layer 150 serves to sense a tensile stress applied to an adjacent layer. In FIG. 18, the strain gauge layer 150 has a structure that is capable of sensing a tensile stress subjected to an upper surface and a lower surface of the display panel 100.

Tensile stress values sensed by the strain gauge layer 150 are supplied to a processor. The processor calculates the tensile stress value and applies a voltage corresponding to a required compressive force to an electrode of the electrical actuation part 200. This is illustrated in a block diagram of FIG. 19 as a control sequence of the display device.

The strain gauge layer 150 may be included in any of the exemplary embodiments of the present invention described herein.

Figure 19:
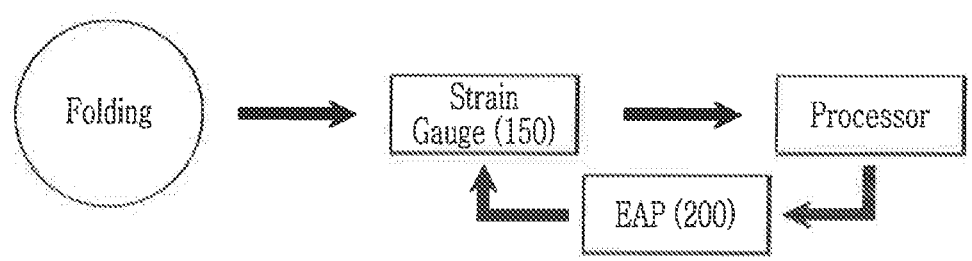
FIG. 19 illustrates steps in which an actuation process is controlled in the exemplary embodiment of FIG. 18.

FIG. 19 illustrates steps in which an actuation process is controlled in the exemplary embodiment of FIG. 18.

First, when the display device is folded, the strain gauge layer 150 in the display device senses information related to the tensile stress applied to a layer adjacent thereto, and transmits the sensed information to the processor.

The processor calculates how much compression force should be applied to the position based on position information and stress magnitude, by using the received information. Then, a voltage signal capable of providing a compressive force corresponding to the two electrodes 210 and 220 of the electrical actuation part 200 is generated and applied to the electrical actuation part 200.

As a result, the compressive force is appropriately generated in the electrical actuation part 200 of the display device, and a tensile stress is reduced in a layer adjacent to the electrical actuation part 200. As a result, a phenomenon in which a specific layer is slipped due to bending of the display device may be prevented, thereby reducing interlayer separation.

Thereafter, as the tensile stress of the adjacent layer is reduced, the strain gauge layer 150 transmits information related to the reduced stress. Accordingly, the voltage is applied to the electrical actuation part 200. This actuation may be repeatedly performed such that the display device is automatically controlled.

The position of the processor is not limited, since the processing may be performed in various positions. For example, according to exemplary embodiments, the processor may be included in a signal controller (e.g., a timing controller) positioned in the display device to control the display panel, the processor may be included in a processor (e.g., a mobile processor unit (MPU)) of an electronic device (e.g., a cellular phone) in which a display device is used, or the processor may be separately positioned outside a signal controller or a main controller.

In FIG. 18, the strain gauge layer 150 is attached to opposite sides of the display panel 100. However, exemplary embodiments of the present invention are not limited thereto. For example, according to an exemplary embodiment, unlike in FIG. 18, the strain gauge layer 150 may be attached to the outside of the adhesive layer 130. In this case, adhesive layers are respectively attached to opposite side surfaces of the display panel 100, and the strain gauge layers 150 are positioned thereon.

According to exemplary embodiments, the strain gauge layer 150 may be formed at various positions. If only one strain gauge layer 150 is used (e.g., to save cost), the strain gauge layer 150 may be attached to a layer having a highest tensile stress. In addition, according to exemplary embodiments, the strain gauge layer 150 may be positioned at a plurality of layers to precisely monitor the tensile stress subjected to each of the layers, and thus, to provide compressive force depending on the monitored results.

Hereinafter, a manner in which a printed circuit board (PCB) is connected to the display device will be described with reference to FIG. 20.

Figure 20:
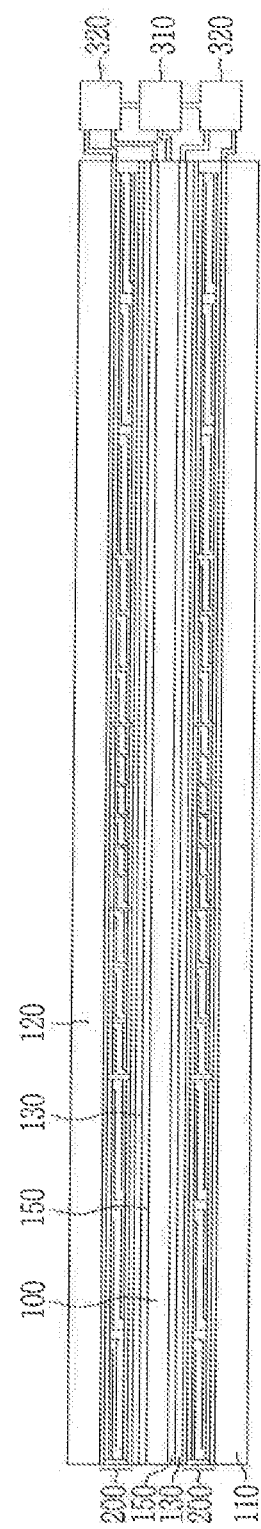
FIG. 20 is a schematic view illustrating a display device according to an exemplary embodiment of the present invention.

FIG. 20 is a schematic view illustrating a display device according to an exemplary embodiment of the present invention.

In FIG. 20, unlike in FIG. 18, a pair of electrical actuation parts 200 are included therein.

The display device according to the exemplary embodiment of FIG. 20 includes a display panel 100, a window 120, a base film 110, a pair of electrical actuation parts 200, a pair of strain gauge layers 150 positioned at opposite sides of the display panel 100, and adhesive layers 130 respectively positioned at outside areas of the strain gauge layers 150. In the flexible display device, since each layer of the display device may be subjected to different stresses due to bending, a pressure sensitive adhesive may be used as an adhesive to alleviate this stress.

The electrical actuation part 200 is positioned on a front surface of the display panel 100 and outside of the upper adhesive layer 130, and the window 120 is positioned outside of the electrical actuation part 200. The window 120 serves to protect the front surface of the display panel 100 from the outside, and is made of, for example, plastic. By providing a constant thickness, the front surface of the display panel 100 may be protected from a force or an impact, as well as from scratches caused by sharp objects.

The display device is positioned on a rear surface of the display panel 100, the electrical actuation part 200 is positioned below the lower adhesive layer 130, and the base film 110 is positioned therebelow to protect the rear surface of the display device. The base film 110 serves to protect the display panel 100 against impacts from the rear surface of the display device. In addition, when the display device is used as a part of any electronic device (e.g., a mobile phone), it may serve to prevent breakage due to collision between the main body of the mobile phone and the display device.

A structure of the electrical actuation part 200 according to the exemplary embodiment of FIG. 20 is identical to that of the electrical actuation part of FIG. 2. However, exemplary embodiments of the present invention are not limited thereto. For example, the electrical actuation part having the structure illustrated in FIGS. 7, 11 and FIG. 14 may be used. In addition, the various electrical actuation parts according to the exemplary embodiments described herein may be used together in one display device.

A display device having such a layered structure is controlled by a signal controller. The signal controller of the display device may be divided into two sections. A first section is a signal controller that serves to control the display panel 100 to display an image, and a second section is a main controller that serves to control all parts of an electronic device including the display device. When the display device is used in a mobile phone, the main controller may serve as a mobile processor unit (MPC). The signal controller for the display device may also be referred to as a timing controller.

The signal controller and the main controller may be positioned on a printed circuit board. In FIG. 20, a pair of flexible circuit boards 320 and one non-flexible circuit board 310 connected thereto are illustrated. The signal controller and the main controller may be positioned at any portion in the flexible circuit boards 320 and the non-flexible circuit board 310. In an exemplary embodiment, the main controller is positioned on the non-flexible circuit board 310.

In FIG. 20, the flexible circuit board 320 is connected to the strain gauge layer 150 and the electrical actuation part 200 of the display device. The upper flexible circuit board 320 is connected to the upper strain gauge layer 150 and the upper electrical actuation part 200, and the lower flexible circuit board 320 is connected to the lower strain gauge layer 150 and the lower electrical actuation part 200. Due to this connection configuration, stress information sensed from the strain gauge layer 150 is provided to the processor through the flexible circuit board 320, and a voltage is provided from the processor to the electrical actuation part 200 through the flexible circuit board 320.

The processor may be positioned in the signal controller that controls the display panel 100 or in the main controller that controls the electronic device. Alternatively, the processor may be positioned separately outside the signal controller or the main controller, and may be positioned on the flexible circuit board 320 or the non-flexible circuit board 310.

The non-flexible circuit board 310 is connected to the pair of flexible circuit boards 320, and is directly connected to the display panel 100. This connection configuration may provide improved characteristics in controlling the display panel 100. The display panel 100 and the non-flexible circuit board 310 may be connected to each other by a flexible circuit board. The signal controller that controls the display panel 100 may be positioned in the flexible circuit board to directly connect the non-flexible circuit board 310 and the display panel 100.

The connection between the flexible circuit board 320 and the non-flexible circuit board 310 illustrated in FIG. 20 may be applied to an exemplary embodiment such as, for example, that of FIG. 1. For example, it may be connected to the electrical actuation part 200 through the flexible circuit board 320. In the structure including the strain gauge layer 150, it may be connected with the strain gauge layer 150 through the flexible circuit board 320.

Although the structure including two strain gauge layers 150 and two electrical actuation parts 200 is illustrated in FIG. 20, according to exemplary embodiments, only one strain gauge layer 150 may be included, or no strain gauge layers 150 may be included. In addition, the strain gauge layer 150 may be further formed inside the window 120 or the base film 110. One of the two electrical actuation parts 200 may be included.

Exemplary embodiments of the present invention utilize an electrical actuation part 200 that uses an electro-active polymer 230 whose characteristics are changed by an electric field. A material for the electro-active polymer 230 and its characteristic will be described with reference to Tables 1 to 3. It is to be understood that the materials included in Tables 1 to 3 are exemplary, and that exemplary embodiments of the present invention are not limited thereto.

TABLE 1

| EAP type | EAP material |
|---|---|
| Electronic EAP | Dielectric EAP Electro strictive Graft Elastomers<br>Electrostrictive Paper<br>Electro-Viscoelastic Elastomers<br>Ferroelectric Polymers (Polyvinylidene Fluoride, PVDF) |
| Ionic EAP | Carbon Nanotubes (CNT)<br>Conductive Polymers (CP)<br>ElectroRheological Fluids (ERF)<br>Ionic Polymer Gels (IPG)<br>Ionic Polymer Metallic Composite (IPMC) |

As shown in Table 1, electro-active polymer (EAP) materials that can be used for the electro-active polymer 230 are classified into electronic EAP and ionic EAP. Table 1 lists exemplary available EAP materials.

Each type of EAP has advantages and disadvantages, which are summarized in Table 2 and Table 3. Table 2 shows the advantages and disadvantages of an electric EAP, and Table 3 shows the advantages and disadvantages of an ionic EAP.

TABLE 2

| EAP type | Electronic EAP |
|---|---|
| Advantage | Fast response speed (milliseconds).<br>Strain may be maintained by DC voltages.<br>A relatively large actuation force may be generated.<br>High mechanical energy density (mechanical energy density).<br>Long-term actuation may be performed at room condition. |
| Disadvantage | A high voltage of about 100 MV/meter is required, and 20 MV/meter is required in the case of a ferroelectric EAP.<br>Monopolar actuation is performed regardless of voltage polarity due to electrostriction phenomenon. |

TABLE 3

| EAP type | Ionic EAP |
|---|---|
| Advantage | Bi-directional actuation is performed depending on a voltage polarity.<br>Actuation is performed by using a low voltage.<br>Some ionic EAP such as a conductive polymer has a bi-stability characteristic. |
| Disadvantage | Electrolyte is required.<br>Electrolyte has an aqueous characteristic at 1.23 V or more.<br>Encapsulation or passivation layer is required to perform actuation in open space.<br>Low electromechanical coupling efficiency.<br>Ionic EAP except conductive polymer or nanotube series may not maintain strain by DC voltage.<br>Relative late reaction speed (0.x seconds)<br>Low actuation force is generated when EAP is bent. |

Referring to Table 2 and Table 3, additional contents and advantages and disadvantages when the present exemplary embodiment is used can be confirmed. Taking the contents of Table 2 and Table 3 into consideration, in the case of electrical EAP, it is possible to perform actuation by applying a DC voltage using a DC converter. In the exemplary embodiment using strain gauge, as illustrated in FIG. 19, the control is performed in real time. For this reason, electrical EAP may be suitable since the reaction speed is high.

The ionic EAP needs to be sealed or encapsulated, so it may be necessary to form a structure (see, e.g., FIG. 2) with, for example, a silicone sealant. It is difficult to apply to a case in which an actuation speed is about 0.x seconds and a response speed is fast. Instead, it may be suitable for shrinking/expanding to a value that is initially set.

Therefore, in consideration of the above characteristics, an EAP material suitable for a display device may be selected and used. In an exemplary embodiment of the present invention, both an electrical EAP and an ionic EAP may be used.

While the present invention has been particularly shown and described with reference to the exemplary embodiments thereof, it will be understood by those of ordinary skill in the art that various changes in form and detail may be made therein without departing from the spirit and scope of the present invention as defined by the following claims.

What is claimed is:

1. A flexible display device, comprising:
a display panel configured to display an image; and
a first electrical actuation part disposed at a first side of the display panel, wherein the first electrical actuation part comprises a first electro-active polymer and a first pair of electrodes,
wherein a first unit structure comprising the first electro-active polymer and the first pair of electrodes is repeatedly formed in the first electrical actuation part,
the first unit structure further comprises a seal member,
the seal member partitions the first electro-active polymer,
the first pair of electrodes comprises an upper electrode disposed above the seal member and a lower electrode disposed below the seal member, and
the seal member comprises a columnar portion that supports the upper electrode and the lower electrode, and a plurality of horizontal portions that respectively extend from the columnar portion along a surface of the lower electrode and along a surface of the upper electrode.

2. The flexible display device of claim 1, wherein the seal member divides the repeatedly formed first unit structures.

3. The flexible display device of claim 1, wherein an end of the horizontal portions does not contact the columnar portion of an adjacent first unit structure, and an opening is disposed at the end of the horizontal portions.

4. The flexible display device of claim 1, wherein a first horizontal portion extending along the surface of the lower electrode and a second horizontal portion extending along the surface of the upper electrode extend away from the columnar portion in different directions, and
the first horizontal portion and the second horizontal portion belong to the plurality of horizontal portions.

5. The flexible display device of claim 1, wherein the repeatedly formed first unit structures have a same width.

6. The flexible display device of claim 1, further comprising:
a second electrical actuation part disposed at a second side of the display panel, wherein the second electrical actuation part comprises a second electro-active polymer and a second pair of electrodes,
wherein a second unit structure comprising the second electro-active polymer and the second pair of electrodes is repeatedly formed in the second electrical actuation part.

7. The flexible display device of claim 6, wherein the repeatedly formed first unit structures and the repeatedly formed second unit structures have a same width, and
the repeatedly formed first unit structures are arranged in a same pattern as the repeatedly formed second unit structures.

8. The flexible display device of claim 1, wherein the first pair of electrodes comprises a plurality of upper electrodes and one lower electrode, the lower electrode has one plate-like structure, and the upper electrodes are insulated from one another.

9. The flexible display device of claim 8, wherein each of the upper electrodes comprises a vertical portion and a plurality of horizontal portions extended from the vertical portion.

10. The flexible display device of claim 1, wherein the first electro-active polymer comprises at least one of an electrical electro-active polymer material or an ionic electro-active polymer material.

11. A flexible display device, comprising:
a display panel configured to display an image; and
a first electrical actuation part disposed at a first side of the display panel, wherein the first electrical actuation part comprises a first electro-active polymer and a first pair of electrodes,
wherein a first unit structure comprising the first electro-active polymer and the first pair of electrodes is repeatedly formed in the first electrical actuation part,
the first electrical actuation part comprises a first zone, a second zone, and a third zone,
the first to third zones comprise first unit structures having different widths, and
a width of the first unit structure of the first zone is larger than a width of the first unit structure of the second zone, and the width of the first unit structure of the second zone is larger than a width of the first unit structure of the third zone.

12. The flexible display device of claim 11, wherein the third zone is disposed near a center of the display panel, the second zone is disposed outside the third zone, and the first zone is disposed outside the second zone.

13. The flexible display device of claim 11, wherein the first zone is disposed at one side of the display panel, and the second zone is disposed at a second side of the display panel that opposes the first side.

14. A flexible display device, comprising:
a display panel configured to display an image;
a first electrical actuation part disposed at a first side of the display panel, wherein the first electrical actuation part comprises a first electro-active polymer and a first pair of electrodes; and
a first strain gauge layer disposed at a surface of the first side of the display panel,
wherein a first unit structure comprising the first electro-active polymer and the first pair of electrodes is repeatedly formed in the first electrical actuation part, and
wherein the first strain gauge layer senses a first stress applied to the surface of the first side of the display panel.

15. The flexible display device of claim 14, wherein the first strain gauge layer is disposed between the first electrical actuation part and the display panel,
the flexible display device further comprises a second strain gauge layer disposed at a surface of a second side of the display panel, and
the second strain gauge layer senses a second stress applied to the surface of the second side of the display panel.

16. The flexible display device of claim 14, further comprising:
a processor configured to control the first electrical actuation part to have a compressive force by receiving stress information sensed by the first strain gauge layer and applying a voltage to the first pair of electrodes of the first electrical actuation part.

17. The flexible display device of claim 16, further comprising:
a flexible circuit board electrically connected to the first strain gauge layer and the first electrical actuation part; and
a non-flexible circuit board electrically connected to the flexible circuit board, wherein the processor is disposed in the flexible circuit board or the non-flexible circuit board.

18. A flexible display device, comprising:
a display panel configured to display an image;
a first electrical actuation part disposed at a first side of the display panel, wherein the first electrical actuation part comprises a first electro-active polymer and a first pair of electrodes;
a window disposed on a front surface of the display panel;
a base film disposed on a rear surface of the display panel;
a first adhesive layer that comprises a pressure sensitive adhesive; and
a second adhesive layer that comprises the pressure sensitive adhesive,
wherein a first unit structure comprising the first electro-active polymer and the first pair of electrodes is repeatedly formed in the first electrical actuation part, and
wherein the window and the display panel are adhered to each other by the first adhesive layer, the display panel and the first electrical actuation part are adhered to each other by the second adhesive layer, and the base film is disposed outside the first electrical actuation part.

19. The flexible display device of claim 18, wherein the display panel is capable of touch sensing.

* * * * *